United States Patent
Fleurial et al.

(10) Patent No.: US 6,660,926 B2
(45) Date of Patent: *Dec. 9, 2003

(54) THERMOELECTRIC DEVICES BASED ON MATERIALS WITH FILLED SKUTTERUDITE STRUCTURES

(75) Inventors: Jean-Pierre Fleurial, Duarte, CA (US); Alex Borshchevsky, Santa Monica, CA (US); Thierry Caillat, Pasadena, CA (US); Donald T. Morelli, White Lake, MI (US); Gregory P. Meisner, Ann Arbor, MI (US)

(73) Assignees: General Motors Corporation, Detroit, MI (US); California Institute of Technology, Pasadena, CA (US)

(*) Notice: Subject to any disclaimer, the term of this patent is extended or adjusted under 35 U.S.C. 154(b) by 63 days.

This patent is subject to a terminal disclaimer.

(21) Appl. No.: 10/007,549

(22) Filed: Nov. 6, 2001

(65) Prior Publication Data

US 2002/0176815 A1 Nov. 28, 2002

Related U.S. Application Data

(63) Continuation of application No. 09/478,976, filed on Jan. 6, 2000, now Pat. No. 6,342,668, which is a division of application No. 08/908,814, filed on Aug. 7, 1997, now Pat. No. 6,069,312, which is a continuation-in-part of application No. 08/189,087, filed on Jan. 28, 1994, now Pat. No. 5,610,366, and a continuation-in-part of application No. 08/412,700, filed on Mar. 29, 1995, now Pat. No. 5,747,728

(60) Provisional application No. 60/023,512, filed on Aug. 7, 1996.

(51) Int. Cl.[7] .......................... H01L 35/28; H01L 35/12

(52) U.S. Cl. ...................... 136/203; 136/205; 136/236.1

(58) Field of Search ................. 136/203, 205, 136/236.1, 238, 239, 240

(56) References Cited

U.S. PATENT DOCUMENTS

| | | | | |
|---|---|---|---|---|
| 5,610,366 A | * | 3/1997 | Fleurial et al. | 136/202 |
| 5,747,728 A | * | 5/1998 | Fleurial et al. | 136/203 |
| 5,769,943 A | * | 6/1998 | Fleurial et al. | 117/219 |
| 6,069,312 A | * | 5/2000 | Fleurial et al. | 136/236.1 |

OTHER PUBLICATIONS

D. Morelli, et al. "Low Temperature Properties of the Filled Skutterudite CeFe4Sb12," *J. Appl. Phys.*, vol. 77, No. 8, pp. 3777–3781 (Apr. 15, 1995).

D. T. Morelli, et al., "Low–Temperature Transport Properties of P–Type CoSb3," *The American Physical Society Physical Review B*, vol. 51, No. 15, pp. 9622–9628 (Apr. 15, 1995).

L. Nordstrom, et al., "Electronic structure of Ce–filled skutterudites," *The American Physical Society Physical Review B*, vol. 53, No. 3, pp. 1103–1108 (Jan. 15, 1996).

T. Caillet, et al., "Bridgeman–solution growth and characterization of the skutterudite compounds CoSb3 and RhSb3," *Journal of Crystal Growth*, vol. 166, pp. 722–726 (Sep. 1, 1996).

(List continued on next page.)

*Primary Examiner*—Patrick Ryan
*Assistant Examiner*—Thomas H. Parsons
(74) *Attorney, Agent, or Firm*—Fish & Richardson, P.C.

(57) ABSTRACT

A class of thermoelectric compounds based on the skutterudite structure with heavy filling atoms in the empty octants and substituting transition metals and main-group atoms. High Seebeck coefficients and low thermal conductivities are achieved in combination with large electrical conductivities in these filled skutterudites for large ZT values. Substituting and filling methods are disclosed to synthesize skutterudite compositions with desired thermoelectric properties. A melting and/or sintering process in combination with powder metallurgy techniques is used to fabricate these new materials.

38 Claims, 18 Drawing Sheets

OTHER PUBLICATIONS

I. Oftdel, "Die Kristallstruktur von Skutterudit und Speiskobalt–Chloanthit", *Z. Kristallogr.,* No. 66., pp. 517–546 (Olso, 1928), No English Translation.

L. Brattas, et al., "On the Properties of the Zirconium & Hafnium Dichalcogenides," *Acta Cehmica Scandinavica,* No. 27, pp. 1290–1298 (Olso, 1973).

A. Kjekshus, et al., "Compounds with the Skutterudite Type Crystal Structure," *Acta Cehmica Scandinavica,* No. 27, pp. 1307–1320 (Olso, 1973).

J.P. Odile, et al., "Crystal Growth & Characterization of the Transition–Metal Phosphides CuP2, NiP2, and RhP3," *Inorganic Chemistry,* vol. 17, No. 2, pp. 283–286 (1978).

F. Grandjean, et al., "Some Physical Properties of LaFe4P12 Type Compounds," *J. Phys. Chem. Solids,* vol. 45, No. 8/9, pp. 877–886 (1984).

G.P. Meisner, et al. "UFe4P12 and CeFe4P12: Nonmetallic Isotypes of Superconducting LaFe4P12," *J. Appl. Physics,* vol. 57, No. 1, pp. 3073–3075 (Apr. 15, 1985).

D. Jung, et al., "Importance of the X4 Ring Orbitals for the Semiconducting, Metallic, or Superconducting Properties of Skutterudites MX3 and RM4X12," *Inorganic Chemistry,* vol. 29, pp. 2252–2255 (1990).

N.T. Stetson, et al., "The Synthesis and Structure of Two Filled Skutterudite Compounds: BaFe4Sb12 and BaRu4Sb12," *Journal of Solid State Chemistry,* vol. 91, pp. 140–147 (1991).

G. Ch. Christakudis, et al., "Thermoelectric Figure of Merit of Some Compositions in the System (GeTe)1–x[(Ag2Te)1–y(Sb2Te3)y]x," *Phys. Stat. Sol.*(a), vol. 128, pp. 465–471 (Moscow, 1991).

Y. Noda, et al., "Temperature Dependence of Thermoelectric properties of Mg2SiO·6Geo·4," *Materials Transactions, JIM,* vol. 33, No. 9, pp. 851–855 (Japan, 1992).

C.B. Vinning, "The Thermoelectric Limit ZT~1: Fact or Artifact," *Proceedings from the XIth International Conference on Thermoelectrics,* Arlington, TX, pp. 223–231 (Oct. 7–9, 1992).

T. Caillat, et al., "Novel Transition Metal Compounds with Promising Thermoelectric Properties," *Proceedings from the XIIth International Conference on Thermoelectrics,* Yokohama, Japan, pp. 132–136 (Nov. 9–11, 1993).

T. Caillat, et al., "Preparation and Thermoelectric Properties of p–and n–Type IrSb3" *Proceedings from the XIIIth International Conference on Thermoelectics,* Kansas City, MO, Am. Inst. Of Physics Press No. 316, pp. 31–34 (1995).

T. Caillat, et al., "Preparation & Thermoelectric Properties of p–and n–type CoSb3" *Proceedings from the XIIIth International Conference on Thermoelectics,* Kansas City, MO, Am. Inst. Of Physics Press No. 316, pp. 58–61 (1995).

\* cited by examiner

Transition Metal  Pnicogen

THERMOELECTRIC DEVICES BASED ON MATERIALS WITH FILLED SKUTTERUDITE STRUCTURES

RELATED APPLICATIONS

This application is a continuation application of U.S. application Ser. No. 09/478,976 entitled "NOVEL THERMOELECTRIC MATERIALS WITH FILLED SKUTTERUDITE STRUCTURE FOR THERMOELECTRIC DEVICES" and filed Jan. 6, 2000, which is now U.S. Pat. No. 6,342,668. The application Ser. No. 09/478,976 is a divisional application of U.S. application Ser. No. 08/908,814 entitled "THERMOELECTRIC MATERIALS WITH FILLED SKUTTERUDITE STRUCTURE FOR THERMOELECTRIC DEVICES" and filed on Aug. 7, 1997, which is now U.S. Pat. No. 6,069,312. The application Ser. No. 08/908,814 is a continuation-in-part application of U.S. patent application Ser. Nos. 08/189,087, entitled "High Performance Thermoelectric Materials and Method of Preparation" and filed on Jan. 28, 1994 (now U.S. Pat. No. 5,610,366), and 08/412,700, entitled "Advanced Thermoelectric Materials with Enhanced Crystal lattice Structure and Methods of Preparation" and filed on Mar. 29, 1995 (now U.S. Pat. No. 5,747,728). The application Ser. No. 08/908,814 further claims the benefit of U.S. Provisional Patent Application No. 60/023,512, filed on Aug. 7, 1996.

STATEMENT REGARDING FEDERALLY SPONSORED RESEARCH OR DEVELOPMENT

The invention described herein was made in the performance of work under a NASA contract, and is subject to the provisions of Public Law 96-517 (35 U.S.C. 202) in which the Contractor has elected to retain title.

BACKGROUND OF THE INVENTION

1. Field of the Invention

The present invention relates to thermoelectric materials and devices. More particularly, the present disclosure describes a class of thermoelectric semiconducting and semi-metallic alloys with a filled skutterudite structure and applications thereof for thermoelectric devices.

2. Description of the Related Art

Thermoelectric materials are a class of materials that can efficiently convert between thermal energy and electrical energy. The Seebeck effect is the phenomenon underlying the conversion of heat energy into electrical power and is used in thermoelectric power generation. The Peltier effect is related to the Seebeck effect and is a phenomenon in which heat absorption accompanies the passage of current through the junction of two dissimilar materials. The Peltier effect is used in thermoelectric refrigeration or other cooling applications. In addition, thermoelectric materials are used in heating applications and thermoelectric sensing devices.

Only certain materials have been found usable with these effects, which has limited the ability to use this effect.

Some thermoelectric materials are semiconducting or semi-metallic. These materials conduct electricity by using two types of carriers: electrons and holes. When one atom in a crystal is replaced by another atom with more valence electrons, the extra electrons from the substituting atom are not needed for bonding and can move around throughout the crystal. A semiconductor is called n-type if the conducting carriers are electrons. On the other hand, if an atom in the crystal is replaced with an another different atom having fewer valence electrons, one or more bonds are left vacant and thus positively charged "holes" are produced. A semiconductor is called p-type if the conducting carriers are holes.

In the above-mentioned thermoelectric devices, both n-type and p-type thermoelectric materials are usually needed.

Thermoelectric devices can have distinct advantages in many applications. For example, an electric power generator based on thermoelectric materials does not use moving parts like conventional power generators. This feature significantly enhances the reliability of the thermoelectric devices by avoiding mechanical wear of the moving parts and corresponding failure. This further reduces the cost of maintenance. Thermoelectric devices allow operations in hostile environments such as in high temperature conditions (e.g., 900° C.) without human attendance. The unique properties of thermoelectric materials also make the thermoelectric devices environmentally friendly, i.e., industrial heat waste or natural heat sources can be used to generate electric power.

The efficiency of a thermoelectric material is often characterized by a thermoelectric figure of merit, ZT. The figure of merit ZT is a dimensionless parameter and is conventionally defined as:

$$ZT = \frac{S^2 \sigma T}{\kappa}, \tag{1}$$

where $S$, $\sigma$, $\kappa$, and $T$ are the Seebeck coefficient, electrical conductivity, thermal conductivity, and absolute temperature, respectively. The larger the ZT, the higher the energy conversion efficiency of a thermoelectric material. An efficient thermoelectric material should have a large Seebeck coefficient, high electrical conductivity, and low thermal conductivity.

Much interest in thermoelectricity was shown between 1957 and 1963 because of the expectations that a high thermoelectric energy conversion efficiency could be achieved and results transferred to large-scale applications. At that time, bismuth telluride ($Bi_2Te_3$) and lead telluride (PbTe) were found among the most efficient thermoelectric materials. Many companies and laboratories were involved in the search for better thermoelectric materials. Later on, $Si_{1-x}Ge_x$ alloys were added as a prime material for high-temperature space applications. By optimizing the doping level and the composition of state-of-the-art materials, significant improvements were obtained and maximum ZT values close to 1 were reproducibly achieved.

Numerous thermoelectric materials have been synthesized and their properties were investigated. However, the search for materials which combine high electrical conductivity, high Seebeck coefficient and low thermal conductivity did not result in any breakthroughs.

For the entire temperature range of −100° C. to 1000° C., maximum ZT of conventional thermoelectric materials are limited to values of about 1, which were supported by the experimental results achieved at that time. Some workers in the art believed that a ZT of 1 may be a limit common to all thermoelectric materials. However, theoretical attempts to determine such a boundary condition for the dimensionless figure of merit ZT have been unsuccessful so far.

In addition to the low conversion efficiency found in the previous thermoelectric materials, the cost to synthesize these materials is high and thus commercial applications of such devices are often not viable. Furthermore, for the state-of-art thermoelectric materials such as PbTe and $Bi_2Te_3$ alloys, the number of isostructural compounds is limited and the possibilities to optimize their properties for maximum performance at different temperatures of operation are also limited.

A systematic search for advanced thermoelectric materials was initiated at the Jet Propulsion Laboratory (JPL) several years ago and resulted in the discovery of a new family of promising semiconducting materials with the skutterudite crystal structure.

Skutterudite structure was originally attributed to a mineral from Skutterud of Norway that has a general formula $TPn_3$, in which element T can be Co, Rh, or In and Pn can be P, As or Sb. The unit cell of the skutterudite structure (prototype $CoAs_3$) iscubic space groupIm3 and has a square radical $[As_4]^{4-}$. This anion located in the center of the smaller cube is surrounded by eight $Co^{3+}$ cations. The unit cell was found to have eight smaller cubes that are often called octants. Two of the octants do not have the anions in the center. This is desirable to maintain the ratio $Co:[As_4]=4:3$ so that the total structure remains electrically neutral and semiconducting. Thus, a typical skutterudite structure results from the $Co_8[As_4]_6=2Co_4[As_4]_3$ composition and has thirty-two atoms per unit cell.

FIG. 1 shows a typical skutterudite crystal lattice structure. Transition metal atoms 110 form a cubic lattice 112. Non-metal pnicogen atoms 120 form a four-member planary ring 122 which is disposed within the cubic lattice structure 112. Each transition metal atom 110 has six neighboring transition metal atoms 110. Each pnicogen atom 120 has two adjacent pnicogen atoms 120 and two transition metal atoms 110. The covalent bonding associated with a skutterudite-type crystal lattice structure provides high carrier mobility. The complex structure and heavy atoms associated with skutterudite-type crystals also result in relatively low thermal conductivity. These two properties in combination are desirable in improving thermoelectric properties in new semiconductor materials.

Various skutterudite structure materials have been investigated for applications in thermoelectric devices. It is known in the art that high carrier mobility values are usually found in crystal structures with a high degree of covalency. The bonding in a skutterudite structure has been found to be predominantly covalent. Moreover, high hole mobility values have been measured in several skutterudite compounds including $IrSb_3$, $RhSb_3$, $CoSb_3$, and $RhP_3$.

In addition, thermoelectric materials with a filled skutterudite crystal structure have also been synthesized. The chemical composition of these types of compounds can be represented by the following formula for half of the unit cell:

$$LnT_4Pn_{12} \qquad (2)$$

where Ln includes rare earth elements such as La, Ce, Pr, Nd, Sm, Eu, Gd, Th, and U; T includes transition metal elements such as Fe, Ru, and Os; and Pn includes non-metal atoms such as pnicogen elements P, As, and Sb. The empty octants of the skutterudite, which are formed in the $TPn_3$ ($\sim T_4Pn_{12}$) framework, are filled with a rare earth element. Because the $T_4Pn_{12}$ groups using Fe, Ru or Os are electron-deficient relative (by $4e^-$) to the unfilled skutterudite electronic structure that uses Co, Rh, or Ir, the introduction of the rare earth atoms compensates this deficiency by adding free electrons. However, the number of valence electrons contributed by the rare earth atoms is generally insufficient. For example, La has $3^+$ oxidation states, and Ce can be $3^+$ or $4^+$. Therefore, most of these filled skutterudite compounds behave as metals, or very heavily doped p-type semi-metals.

SUMMARY OF THE INVENTION

Skutterudites seem promising for highly efficient thermoelectric materials. This is in part due to their large mobility values. A typical unit cell in these compounds is relatively large with 32 to 34 atoms and has a cubic geometry. The electric properties of binary skutterudite materials are attractive for thermoelectric applications. However, thermal conductivity of these binary skutterudites at room temperature is in an approximate range from 100 mW $cm^{-1}$ $K^{-1}$ to 150 mW $cm^{-1}$ $K^{-1}$. This is too high and makes high ZT values difficult to achieve since ZT is inversely proportional to the thermal conductivity as shown by Equation (1). Substantial reductions in the lattice thermal conductivity are desirable to achieve ZT values comparable to those of state-of-the-art thermoelectric materials which is in a range of 10 mW $cm^{-1}$ $K^{-1}$~40 mW $cm^{-1}$ $K^{-1}$.

The inventors have devised different approaches to solve the problem.

One approach is to use binary compounds with high carrier mobility to form solid solutions with other binary compounds or a new ternary/quaternary isostructural phase using the transition metal and/or the pnicogen site(s).

Another approach is to prepare new ternary and quaternary skutterudite phases, derived from the binary compounds by substituting the transition metal element and/or the pnicogen element with elements from adjacent columns of the periodic table. Both these approaches have been disclosed in U.S. Pat. Nos. 5,610,366 and 5,747,728.

The present application further discloses another new class of advanced thermoelectric materials, filled skutterudite compositions with a variety of atomic substitutions and combinations. This is a continuation of the above referenced U.S. patent applications in developing new high-efficiency thermoelectric materials and devices.

According to the present application, the thermal conductivity of a skutterudite can be reduced by filling the two empty octants present in the 32-atom unit cell of a binary compound and in addition substituting elements to replace part of the original transition metal and/or pnicogen elements to conserve the valence electron count of the unit cell. This novel filled skutterudite structure is believed to lead to a new class of thermoelectric materials of high ZT values in a wide temperature range and many engineering versatilities.

The inventors recognized that the unique structure of skutterudite crystals has the potential to achieve high electrical conductivity and low thermal conductivity for highly efficient thermoelectric materials.

In particular, the inventors recognized that a heavy filling atom in a filled skutterudite structure can effectively scatter phonons so as to substantially reduce the lattice thermal conductivity of the unfilled compound. The inventors recognized, importantly, that the filling atom in an empty octant will not substantially decrease the high carrier mobility, which is desirable in achieving high ZT values in such compounds.

The inventors recognized the importance of maintaining the semiconducting properties of a filled skutterudite crystal to achieve high Seebeck coefficients. The inventors recognized that substituting atoms can be used to modify the carrier concentration and to further increase the phonon scattering to reduce the thermal conductivity.

The inventors also recognized that both doping level and conductivity type (i.e., n-type or p-type ) in a filled skutterudite structure can be controlled by changing the ratio between the substituting atoms and the filling atoms.

One aspect of the present invention is a novel structure of filled skutterudite compounds with substituting atoms. This new class of compounds is thermoelectric materials with high ZT values, low thermal conductivity and high electrical conductivity. Examples of such new materials which have been prepared in accordance with the present invention include, but are not limited to, $CeFe_4Sb_{12}$, $CeRu_4Sb_{12}$, $CeFe_4As_{12}$, $CeRu_4As_{12}$, $CeFe_{4-x}Co_xSb_{12}$, $CeFe_{4-x}Ni_xSb_{12}$, $CeFe_{4-x}Ru_xSb_{12}$, $CeFe_4Sb_{12-y}As_y$, $LaFe_4Sb_{12}$, and $CeFe_4GeSb_{11}$, in which $0 \leq x \leq 4$ and $0 \leq y \leq 12$.

Another aspect of the present invention is the use of many substituting techniques to construct a variety of filled skutterudites with different desired properties. For example, one such technique is replacing a pnicogen element or a transition metal element in a filled skutterudite with a different main-group element such as an element from columns 14, 15, 16 of the periodic table or a different transition metal element in the same row of the periodic table and adjusting the carrier concentration thereof. Examples of such compounds include $CeFe_{4-x}Ni_xSb_{12}$ and $CeFe_4Ge_xSb_{12-x}$ for $0 \leq x \leq 12$. Another substituting technique uses an "alloying" technique to substitute a pnicogen element or a transition metal element in a filled skutterudite with a different pnicogen or transition metal element in the same column of the periodic table, e.g., $CeFe_{4-x}Ru_xSb_{12}$ for $0 \leq x \leq 4$ and $CeFe_4Sb_{12-y}As_y$ for $0 \leq y \leq 12$. An element in the structure may also be replaced by a different element at a different row and different column in the periodic table. Furthermore, the concentration of a filling element can be varied, or more than one filling element can be used to achieve desired filled skutterudites. Examples of this type of compound include $Ce_yFe_{4-x}Ni_xSb_{12}$ for $0 \leq x \leq 4$ and $0 \leq y \leq 1$ or $Ce_{1-x}Eu_xFe_4Sb_{12}$ for $0 \leq x \leq 1$.

Another aspect of the invention is the preparation of the such new semiconductor compounds by using an economic and efficient method to facilitate the commercialization of the invention. In particular, the present invention discloses a synthesizing process to form polycrystalline filled skutterudite compositions for thermoelectric devices.

Yet another aspect of the invention is using such new materials in a variety of thermoelectric devices for electric power generation, heating applications, cooling applications, and sensing devices. For example, the weight, volume, cost of thermoelectric power generators for spacecraft used in deep space missions need to be reduced, and thermoelectric materials which can achieve thermoelectric conversion efficiency better than about 13% are desirable. In terrestrial applications, such new thermoelectric power generators preferably can work with a heat source of 600° C. to 800° C. as in heat recovery from a processing plant of combustible solid waste. Generating electric power from waste exhaust heat (about 400° C. to 700° C.) to supplement or replace the alternator in automobiles is another potential application in reducing fuel consumption.

BRIEF DESCRIPTION OF THE DRAWINGS

These and other aspects and advantages, the sophistication, and significance of the present invention will become more apparent in light of the following detailed description of the invention and the claims, as illustrated in the accompanying drawings.

DETAILED DESCRIPTION OF THE INVENTION

Filled Skutterudite Compositions

Figure 1:
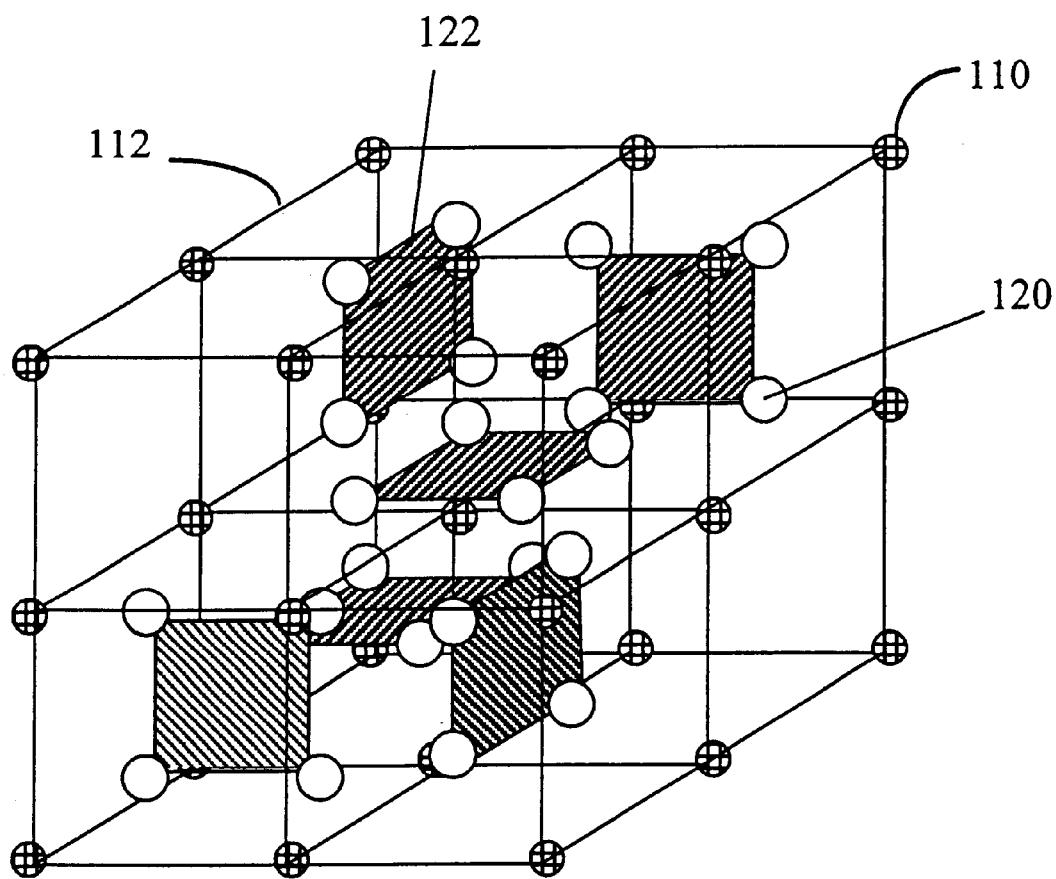
FIG. 1 is a schematic diagram showing an unfilled skutterudite structure having eight transition metal atoms and twenty-four pnicogen atoms.
Figure 1:
Figure 1:
Figure 2:
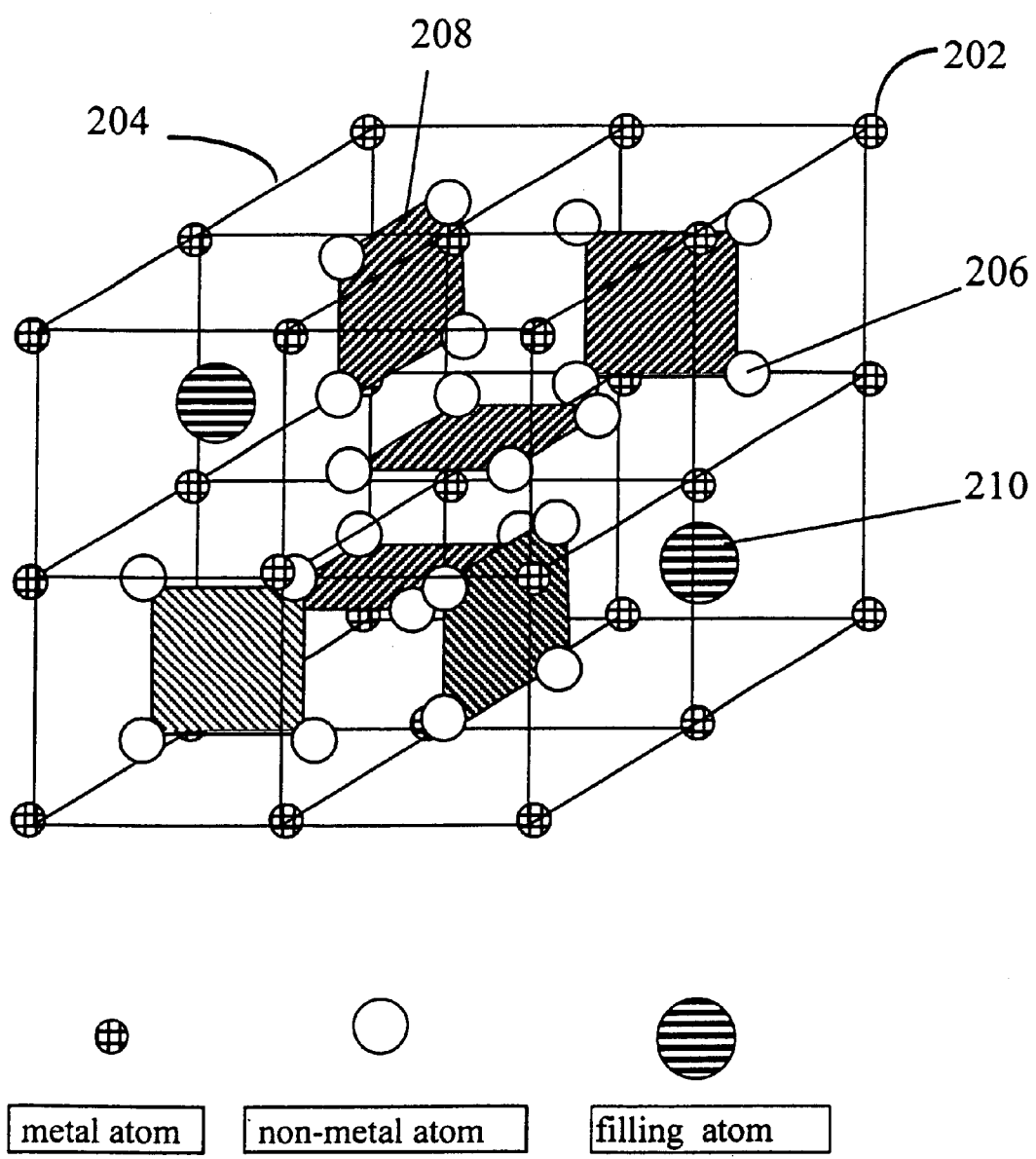
FIG. 2 is a schematic diagram showing a filled skutterudite structure in accordance with the present invention, which includes eight transition metal atoms, twenty-four pnicogen atoms, and two filling atoms.

FIG. 2 shows a cubic filled skutterudite structure with substituting elements in accordance with one embodiment of the invention. Metal atoms 202 (T) form a cubic lattice 204 which has eight octants. Six octants are each occupied with a square planar ring 208 formed by four non-metal atoms 206 (Pn). Two filling atoms 210 (R) fill in the remaining two empty octants. A filled skutterudite structure lattice thus can be represented by a 34-atom unit cell: eight metal atoms, twenty-four non-metal atoms, and two filling atoms.

A filled skutterudite structure with substituting atoms can be derived from an unfilled binary skutterudite compound $TPn_3 \equiv T_4Pn_{12}$, where T and Pn represent metal atoms and non-metal atoms, respectively. $CoSb_3$ is an example of this type. The chemical composition of such a filled skutterudite material can be symbolically expressed as the following for half of the unit cell:

$$R_f T_4 Pn_{12}, \qquad (3)$$

where f represents the filling fraction of the skutterudite structure, $0 \leq f \leq 1$. The new chemical composition based on the above structure in accordance with the present invention can be symbolically expressed as:

$$R_{f(1-r)}\overline{R}_{fr} T_{4-x}\overline{T}_x Pn_{12-y}\overline{Pn}_y, \qquad (4)$$

where $\overline{T}$, $\overline{Pn}$, and $\overline{R}$ represent the substituting atoms to replace the metal atoms T, substituting atoms to replace the non-metal atoms Pn, and the substituting atoms to replace the filling atoms R, respectively. The subscripts x ($0 \leq x \leq 4$), y ($0 \leq y \leq 12$), and r ($0 \leq r \leq 1$) in the formula (4) respectively represent the concentration levels of each element.

The metal element T or $\overline{T}$ may include elements in columns 7, 8, 9, 10, and 11 (i.e., main-groups VIIA, VIII, and IA) in the periodic table. Specifically, the elements that may be used for T or $\overline{T}$ include Mn and the transition metals including Tc, Re, Fe, Ru, Os, Co, Rh, Ir, Ni, Pd, Pt, Cu, Ag, and Au. Preferably, elements Mn, Fe, Ru, Co, Rh, Ir, and Ni are used. More preferably, Fe, Co, Ru, Ir, and Ni are used. In particular, the inventors recognized that each of these metal elements can be used to achieve a desired material property based on atomic parameters such as valence electron count, atomic mass, and atomic volume. In this context, each one of the metal elements may be unique and different. For example, Fe and Co may have similar atomic mass and volume but they have different valence electron count. Thus, in certain compositions, exchanging Fe and Co may yield different material properties such as electric conductivity and conduction type.

The non-metal elements Pn and $\overline{Pn}$ may include main-group elements in columns 14 (i.e., IVB), 15 (i.e., VB), 16 (i.e., VIB) of the periodic table: C, Si, Ge, Sn, Pb, N, P, As, Sb, Bi, O, S, Se, Te, and Po. Preferably, Si, Ge, Sn, P, As, Sb, S, Se, and Te are used. In particular, P, As, and Sb are most preferable among pnicogen elements and elements Ge, Sn, S, Se, and Te are most preferable for main-group elements IVB and VIB. The inventors recognized that each of these non-metal elements can be unique and different and can be used to achieve desired material properties based on atomic parameters such as valence electron count, atomic mass, and atomic volume.

The filling elements R and $\overline{R}$ are typically metallic elements located in columns 2, 3, and 4 in the periodic table. The preferred filling elements are rare-earth elements, including lanthanides (e.g., Ce, Pr, Nd, Sm, Eu, and Gd) and actinides series (e.g., Th and U), and other metallic elements located near La in the periodic table such as Y, Hf, Zr. More preferably, elements La, Ce, Pr, Nd, and Th are used. Each of these filling elements can uniquely affect the material properties due to its unique atomic parameters including valence electron count, atomic mass, and atomic volume.

One embodiment of the new filled skutterudite materials is a filled skutterudite compound constructed from a binary skutterudite compound. The introduction of a filling atom into the skutterudite structure is expected to substantially reduce the lattice thermal conductivity of the original compound (e.g., $CoSb_3$) with minimal decrease in carrier mobility. The heavy filling atom would "rattle" within its octant "cage" and thus effectively scatter phonons to reduce the lattice thermal conductivity. Also because the filling atom will fill an empty octant, its contribution to the electrical transport would be minimal. The increased phonon scattering rate is believed to somewhat impact the carrier scattering rate which can lead to higher carrier scattering rates and thus reduce the carrier mobility. However, it is important to note that because substituting atoms need to be introduced in quantity, they should also bring a substantial increase in phonon scattering (e.g., mass and volume differences) and carrier scattering (e.g., ionized impurity, disorder) rates.

"Substituting" atoms are introduced into the skutterudite structure due to the addition of the "filling" atoms. One of the reasons for so doing is to conserve the excellent semiconducting behavior of the unfilled binary skutterudites. The concentration ratio of substituting atoms to filling atoms is determined from the number of valence electrons of the filling atom.

The inventors discovered different methods to prepare samples with a filled skutterudite structure for thermoelectric devices. These methods or a combination of at least two of these methods allow synthesis of a filled skutterudite sample having the desired thermoelectric properties suitable for a specific application. Therefore, the present invention can be used to facilitate "engineering" a variety of thermoelectric materials for a wide range of applications.

1. Doping with a Different Element

In accordance with one aspect of the present invention, a filled skutterudite structure is constructed by partially substituting one element with a different element that is positioned in the same row therewith in the periodic table. The substituted element and the substituting element have similar atomic structures, e.g., in terms of atomic mass and atomic radius/volume, but have a different number of valence electrons. Thus, the substitution introduces a change in the carrier density (electrons or holes) and can also alter the conduction type of the skutterudite dependent on the doping action and concentration of the substituting element. However, this change introduces little point defect scattering of the lattice phonons by the substitution. One consequence of such substitution is to produce both n-type and p-type thermoelectric materials for device applications.

Specifically, at least three different approaches can be used to achieve such substitution/doping. Any combination of these three approaches may be applied in accordance with the present invention.

A first approach substitutes at least a portion of transition metal element T with another different transition metal element $\overline{T}$ that is in the same row as T in the periodic table. This is indicated in the formula (4) thereabove. The doping level can be varied by changing the concentration of substituting element $\overline{T}$ while maintaining a constant number of transition metal atoms relative to the total number of pnicogen atoms. For example, a fraction of iron atoms can be replaced by nickel atoms to introduce electrons (donor doping). An example is $CeFe_{4-x}Ni_xSb_{12}$ for $0 \leq x \leq 4$.

A second approach substitutes at least a portion of the pnicogen element Pn with another different pnicogen element $\overline{Pn}$ in the same row of the periodic table. This is also indicated by the formula (4). The doping level can be varied by changing the concentration of substituting element $\overline{Pn}$ while maintaining a constant number of pnicogen atoms relative to the total number of transition metal atoms. For example, a fraction of arsenic may be either replaced by selenium atoms to introduce additional electrons (donor doping) such as in $CeFe_4As_{12-y}Se_y$ ($0 \leq y \leq 12$) or replaced by germanium atoms to introduce holes (acceptor doping) such as in $CeFe_4Ge_yAs_{12-y}$ ($0 \leq y \leq 12$).

A third way of doping substitutes a fraction of filling element R in the formula (4) with another filling element $\overline{R}$ in the same row of the periodic table while maintaining the total number of filling atoms r of the formula (4) unchanged. For example, if rare-earth element praseodymium is originally to fill the empty octants of a filled skutterudite, neodymium or cerium can be used to substitute a portion of Pr. In addition, the total fraction of filling can be changed to adjust the doping level of the filled skutterudite sample. For example, if the rare-earth element Ce is originally to fill all of the empty octants (i.e., f=1), a decrease in the filling fraction (i.e., f<1) will result in a decrease in the electron concentration.

All combinations of the above three substituting methods are implied in this disclosure. For example, one way to form a filled skutterudite is to simultaneously substitute some of the iridium atoms by platinum atoms and some of the antimony atoms by tellurium atoms in $Ir_4Sb_{12}$. Another example is $Ce_{0.8}La_{0.1}Fe_{3.0}Ni_{1.0}Sb_{11.0}Te_{1.0}$.

2. Alloying by Substitution

The present techniques also include substitution of one element in a filled skutterudite by a different element in the same column in the periodic table. The substituted element and the substituting element have the same number of valence electrons (i.e., isoelectronic) but their atomic mass and radius are different. Such substitution can preserve the conduction type and carrier density. The significance of this method is to purposely introduce point defects in the crystal lattice due to the mismatch in atomic mass and size, thereby increasing the phonon scattering to decrease the lattice thermal conductivity and increase the thermoelectric figure of merit ZT.

Analogous to the doping method thereabove, at least three different approaches for such substitution may be used: replacing some of the transition metal element with a different transition metal in the same column (e.g., $CeFe_{4-x}Ru_xSb_{12}$ for $0 \leq x \leq 4$); replacing some of the pnicogen element with a different pnicogen element in the same column (e.g., $CeFe_4Sb_{12-y}As_y$ for $0 \leq y \leq 12$); and replacing some of the filling element with another filling element in the same column (e.g, $Ce_{1-x}Th_xFe_4Sb_{12}$ for $0 \leq x \leq 1$).

For example, ruthenium may be used to substitute some of the iron atoms according to the above stated method of the present invention.

Any combination of the above three basic substituting methods can be used according to the present invention. For example, phosphorus can be replaced by antimony to decrease the lattice thermal conductivity. One such example is $Ce_{0.9}Th_{0.1}Fe_{3.0}Ru_{1.0}Sb_{11.0}P_{1.0}$.

3. Changing Concentration Level of Filling Element(s)

One embodiment of the invention allows one or more filling elements to be used to fill the empty octants of a skutterudite lattice. The filling atoms increase the phonon scattering of the lattice, thus reducing the thermal conductivity. If two different elements are used as the filling elements, phonons with two different frequencies may be excited. This could cause an ever larger amount of reduction of the lattice thermal conductivity than using only one filling element in many cases. The present invention further teaches that the total concentration level f of the filling atoms can be changed to achieve a desired property. Referencing formula (4), it is desirable that a change in the f value be accompanied by a corresponding change in the concentration of the substituting transition metal element $\overline{T}$ or the substituting pnicogen element $\overline{Pn}$ or both such that the optimum thermoelectric properties of the compound are obtained.

In general, any one or any combination of at least two of the three methods may be used to obtain a composition with desired properties. For example, an atom in the structure, which can be a transition metal atom, a pnicogen atom, or a filling atom, may be replaced by another atom at a different column and row in the periodic table so that such a substitution effectively performs both doping and alloying at the same time.

The above-described methods may be alternatively viewed as substituting at least any one of the elements R, T, Pn with at least one other element that is located in a neighboring position relative to the original element in the periodic table. The "neighboring position" can be one or more positions away in a column, in a row, or simultaneously shifted one or more positions in both column wise and row wise in the periodic table. Any one of the following or a combination thereof may be used: (1) By filling the structure with various concentrations (or filling fraction f) of one R or several R, R' filling atoms; (2) By completely or partially substituting the transition metal T by one or several neighboring transition metal T' elements in the periodic table (e.g., columns 7 to 10); and (3) By completely or partially substituting the pnicogen element Pn by one or several neighboring main group elements Pn' in the periodic table (e.g., columns 13 to 15).

In view of the above-described methods to construct the new filled skutterudite thermoelectric materials, those skilled in the art will appreciate that the present invention not only discloses a new class of thermoelectric skutterudites but also provides a number of techniques to achieve specific properties with the new filled skutterudites by using proper substituting elements, or proper doping of one or more particular elements, or by using one or more filling elements. Furthermore, any combination of the above-described methods may be used to form a desired skutterudite structure in accordance with the present invention. Such combination further enhances the flexibility in constructing a new structure and achieves desired thermoelectric properties.

For example, one can substitute a portion of a transition metal element T with a different transition metal element that is in a different row and a different column as T in the periodic table (e.g., $CeFe_{4-x}Ir_xSb_{12}$). Another example, a portion of a transition metal element T can be substituted with a different transition metal element in the same row as T in the periodic table while simultaneously replacing some of the pnicogen element Pn with a different pnicogen element in the same column as Pn in the periodic table (e.g., $CeFe_{4-x}Co_xSb_{12-y}As_y$ for ($0 \leq x \leq 4$ and $0 \leq y \leq 12$). As yet another example, a portion of a pnicogen element T can be replaced with two main-group elements (e.g., $CeFe_4Ge_xAs_{12-x-y}Se_y$ for $0 \leq x \leq 12$, $0 \leq y \leq 12$, and $0 \leq x+y \leq 12$). The versatility and flexibility of the present invention allows for the design of a thermoelectric skutterudite for a specific application with desired thermoelectric properties.

For example, if rare-earth element cerium Ce, whose most stable valence number is 3, is introduced into the two empty octants of the 32-atom $CoSb_3$ unit cell, six atoms of transition metal iron Fe, each providing one acceptor per atom, are preferably to be substituted for transition metal cobalt Co atoms. Thus, $CoSb_3$ (or $Co_4Sb_{12}$) becomes $CeFe_3CoSb_{12}$. This composition is very close to the p-type semi-metallic compound $CeFe_4Sb_{12}$ whose existence was previously reported. In general, the percentage of filling cerium atoms and the percentage of substituting iron atoms can be varied as expressed in the following:

$$Ce_fFe_xCo_{4-x}Sb_{12} \qquad (5)$$

where $0 \leq f \leq 1$, $0 \leq x \leq 4$. The inventors discovered that the cerium filling fraction f has a dependence on the cobalt concentration (4−x). The inventors synthesized thermoelectric materials using the filled structure represented by formula (5). The thermoelectric properties of one example of such materials, $CeFe_{3.5}Co_{0.5}Sb_{12}$, was measured and is described hereinafter.

A number of elements can be used for each particular lattice site (R, T and Pn). However, it is desirable to keep the valence electron count of the unit cell within certain limits. Unfilled skutterudite compositions, such as $CoSb_3$, usually have good semiconducting properties with band gap energies ranging from 0.25 eV to larger than 1.5 eV. Each transition metal atom T may contribute nine valence electrons and each pnicogen atom Pn may contribute three valence electrons for a total of 72 electrons in the $T_4Pn_{12}$ cluster. Most of the filled skutterudite compositions, such as $LaFe_4Sb_{12}$, have metallic or semi-metallic properties, due to their deficit in the valence electron count. For example, Fe contributes eight electrons and La contributes three electrons ($La^{3+}$) for a total of 71 electrons in the $RT_4Pn_{12}$ cluster. If a tetravalent filling atom such as Th can be used ($Th^{4+}$), then the valence electron count would be back at 72 and $ThFe_4Sb_{12}$ should be semiconducting.

The inventors discovered that keeping the valence electron count at 72 and obtaining semiconducting filled skutterudite compositions may be important in achieving thermoelectric materials with very low thermal conductivity values but still retaining the excellent electrical properties of unfilled skutterudite compounds. The filling of the empty octants in the skutterudite structure with suitable atoms leads to large reductions in the lattice thermal conductivity. This is at least in part due to the "rattling" displacement of the filling atom in its cage which effectively scatters the phonons that carry the heat through the material. This mechanism may be useful in certain cases since scattering of the phonons of different wavelengths can occur depending on the mass, volume and concentration of the filling atom. This scattering can further decrease the lattice thermal conductivity. Moreover, because the filling atom occupies a previously empty octant in the structure, its impact on the electrical transport properties (electrical resistivity, carrier mobility and Seebeck coefficient) should be minimal. The filling atoms almost always contribute some electrons to the structure and their effect on the transport properties should be taken into account. In order to obviate the electron count problem, one possible choice for filling atoms may be rare gas atoms such as Xe, Kr, since they usually do not modify the valence electron count.

For example, one embodiment for a filled skutterudite structure based on $Co_4Sb_{12}$ may use cerium as the filling atoms and iron for replacing a portion of the cobalt atoms as indicated by formula (5). The inventors found by experimentation that only about 6.5% of the empty octants may be filled with cerium in $CoSb_3$ to form $Ce_{0.065}Co_4Sb_{12}$ while about 100% Ce can be filled into $Fe_4Sb_{12}$ to form $CeFe_4Sb_{12}$. The lattice parameter of $CoSb_3$ changes substantially with the 6.5% Ce filling.

Two other substituting methods described in formula (4) may also be used to form other compositions based on the binary skutterudite $Co_4Sb_{12}$. One uses compensating atoms Ge to replace some of the Sb atoms in the lattice:

$$Ce_fCo_4Ge_ySb_{12-y} \qquad (6)$$

where $0 \leq f \leq 1$ and $0 \leq y \leq 12$. For example, $CeCo_4Ge_3Sb_9$ may be made in this way.

Another method replaces both Co and Sb by Fe and Te, respectively:

$$Ce_fFe_xCo_{4-x}Sb_{12-y}Te_y \qquad (7)$$

which can result in $CeFe_4Sb_{11}Te$, for instance. In the formula (7), $0 \leq f \leq 1$, $0 \leq x \leq 4$, and $0 \leq y \leq 12$. Additional compositions are possible in accordance with the present invention.

Moreover, the doping level and conductivity type can be controlled by changing the substituting to filling atomic ratio. For example, one would expect the $CeFe_2Co_2Sb_{12}$ and $CeFeCo_3Sb_{12}$ compositions to be of n-type conductivity.

New filled skutterudites can also be made from $Co_4Sb_{12}$ with filling atoms cerium and transition metal atoms iron and nickel:

$$Ce_fFe_{4-x}Ni_xSb_{12} \qquad (8)$$

where $0 \leq f \leq 1$ and $0 \leq x \leq 4$. This can result in $Ce_{0.9}Fe_{3.5}Ni_{0.5}Sb_{12}$, for example.

Furthermore, the inventors recognized that unique properties can be obtained from a filled skutterudite structure by replacing an element with a substituting element of significantly different atomic radius and mass. This intentional mismatch in the crystal lattice induces point defects, thus causing large phonon scattering. Therefore, an additional reduction in lattice thermal conductivity can be achieved. For example, filled skutterudite $CeRu_4Sb_{12}$ is a promising candidate for high temperature thermoelectric applications. Instead of using substituting atoms Rh or Pd, one can use Fe to replace some of the Ru atoms in the lattice and thereby to further reduce the thermal conductivity. The chemical composition of such skutterudites can be expressed as:

$$Ce_fFe_{4-x}Ru_xSb12, \qquad (9)$$

where $0 \leq f \leq 1$ and $0 \leq x \leq 4$.

The following are other composition examples of the filled skutterudite structure in accordance with the invention.

Example:

$$R_fFe_{4-x}T_xSb_{12}, \qquad (10)$$

where R is a rare earth element of the lanthanides series, T represents Co, Ni, Ir, or Ru, $0 \leq f \leq 1$ and $0 \leq x \leq 4$. This composition may be advantageous in applications at high temperatures.

Example:

$$R_fRu_{4-x}T_xSb_{12-y}Pn_y, \qquad (11)$$

where R is a rare earth element of the lanthanides series, T represents Co, Ni, or Fe; Pn is a pnicogen atom and preferably P or As; $0 \leq f \leq 1$, $0 \leq x \leq 4$, $0 \leq y \leq 12$. This composition may be advantageous in applications at the room temperature.

Filled compositions may also be formed based ternary compounds according to the invention. For example,

(12)

and

(13)

where R is again a rare earth element of the lanthanides series, $0 \leq f \leq 1$, and $0 \leq x \leq 1$.

The inventors also recognized that some elements may be substituted by less expensive elements to reduce the manufacturing cost. For example, the relatively inexpensive elements such as Mn, Fe, Co, Ni may be used for the needed transition metals; a pnicogen element position may be filled by Sb; inexpensive rare earth elements such as La, Ce, Pr, and Nd may be used as the filling elements. In addition, dopants such as Ge, Sn, and Te may be used for a lower cost.

Measured Thermoelectric Properties for Some Samples

A great variety of filled skutterudite compositions can be prepared using any one or a combination of the above different methods in accordance with the invention. Preferably, the total valence electron count for a cluster of $R_f R'_f T_{4-x} T'_x Pn_{12-y} Pn'_y$ is maintained between 71 and 72. The behavior of these materials ranges from completely semiconducting when the valence electron count approaches 72 to completely metallic when the valence electron count approaches 71. FIGS. 3 to 15 show some results measured by the inventors.

Figure 3:
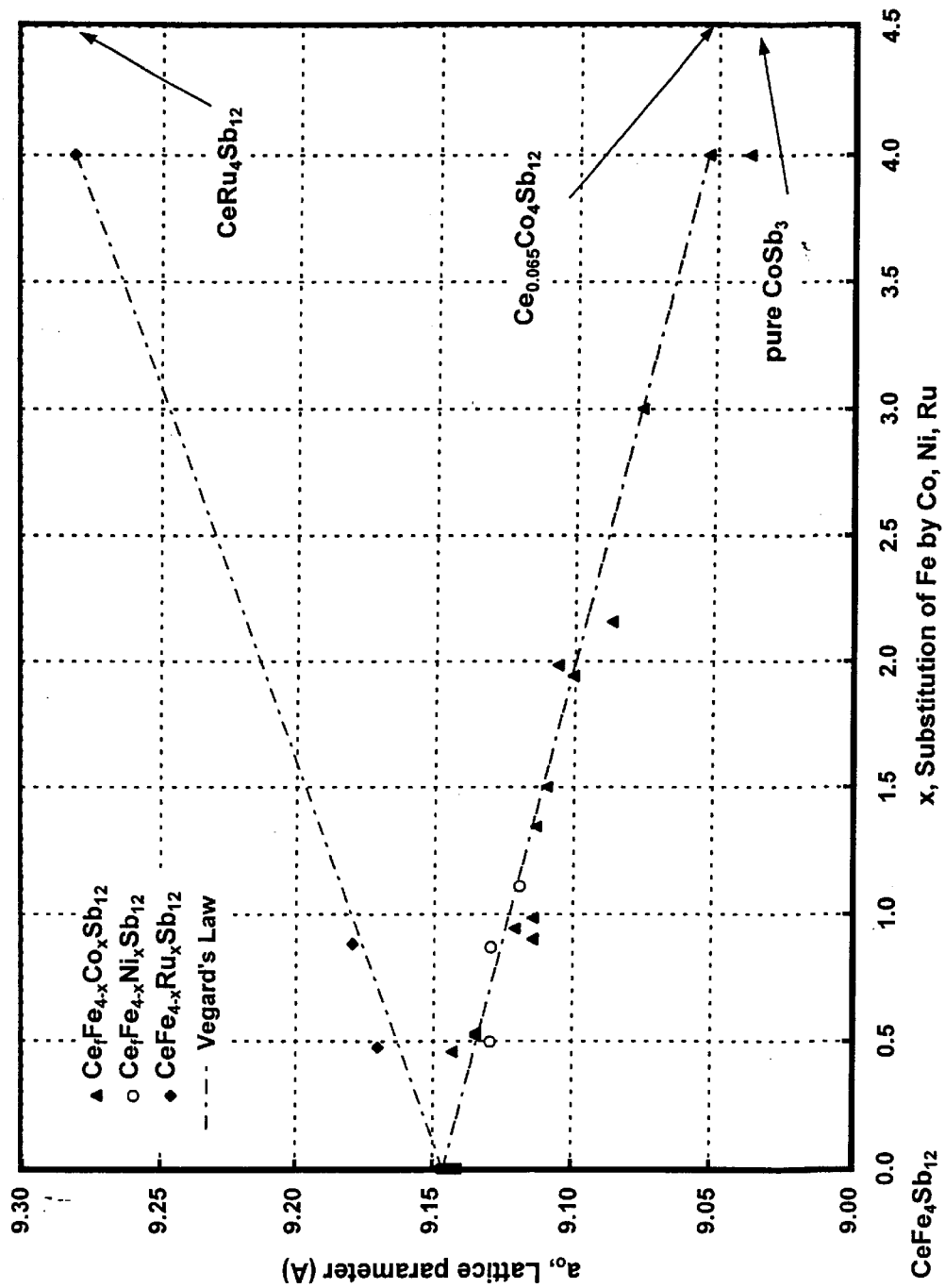
FIG. 3 shows the variations in the lattice parameter of the cubic filled skutterudite structure for three different ranges of composition: $CeFe_4Sb_{12}$—$CoSb_3$, $CeFe_4Sb_{12}$—$CeRu_4Sb_{12}$ and $CeFe_4Sb_{12}$—"$NiSb_3$".

FIG. 3 shows variations in the lattice parameter of the cubic filled skutterudite structure for three different ranges of composition: $Ce_f Fe_{4-x} Co_x Sb_{12}$, $Ce_f Fe_{4-x} Ru_x Sb_{12}$ and $Ce_f Fe_{4-x} Ni_x Sb_{12}$. The dotted lines correspond to linear interpolation results based on Vegard's law for the $CeFe_4 Sb_{12}$—$Ce_{0.065} Co_4 Sb_{12}$, and $Ce_f Fe_4 Sb_{12}$—$CeRu_4 Sb_{12}$ systems. Because there is no such compound as "NiSb$_3$", only partial substitution of Fe by Ni can be achieved.

Figure 4:
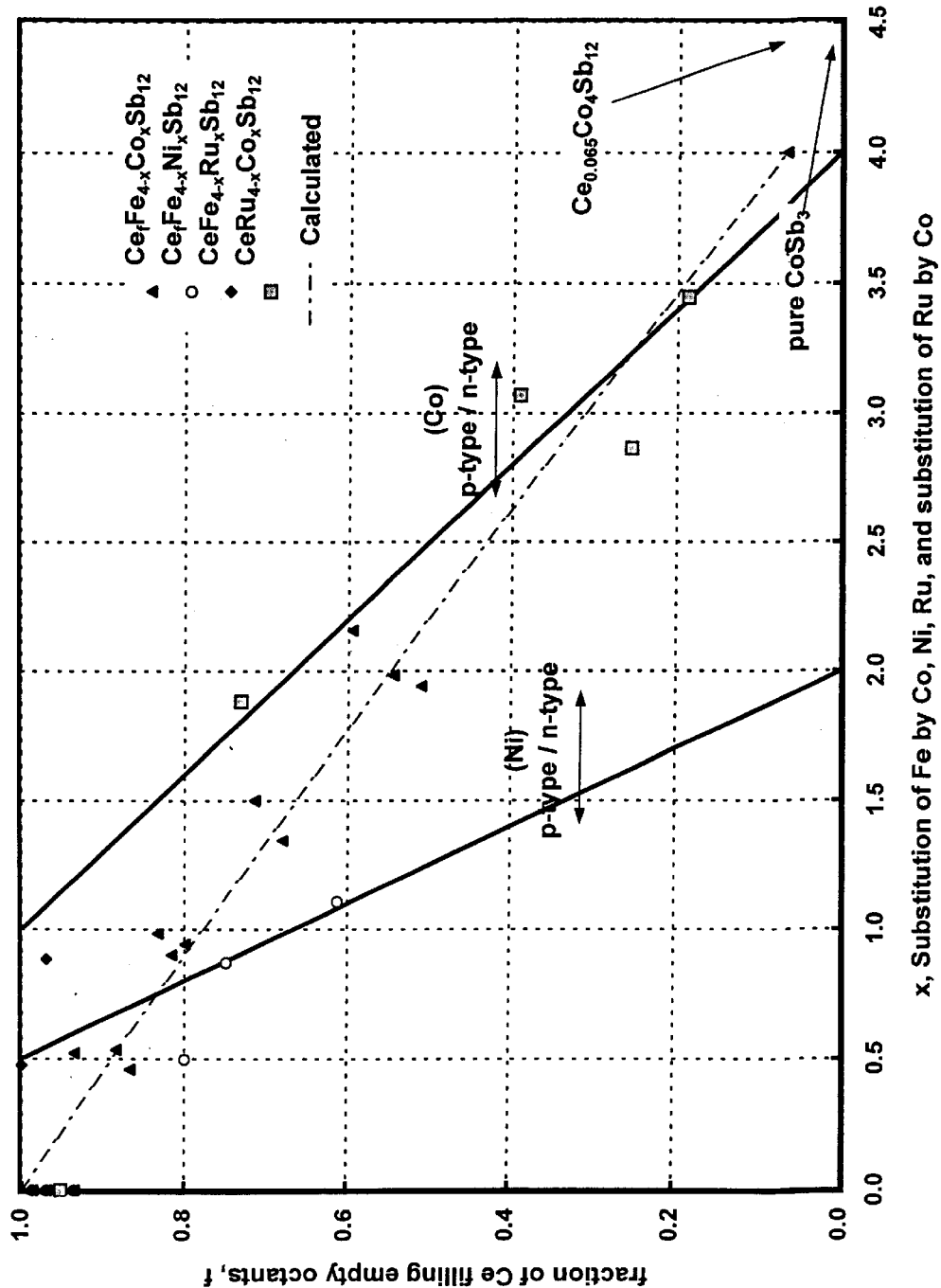
FIG. 4 is a chart showing variations in the Ce filling fraction (f=1 represents complete filling of the two sites available in the skutterudite structure) for three different ranges of composition: $CeFe_4Sb_{12}$—$CoSb_3$, $CeFe_4Sb_{12}$—$CeRu_4Sb_{12}$ and $CeFe_4Sb_{12}$—"$NiSb_3$".

FIG. 4 shows the experimental variations in the Ce filling fraction (f=1 represents complete filling of the two sites available in the skutterudite structure) for three different ranges of composition: $CeFe_4 Sb_{12}$—$CoSb_3$, $CeFe_4 Sb_{12}$—$CeRu_4 Sb_{12}$ and $CeFe_4 Sb_{12}$—"NiSb$_3$". The amount of Ce in the skutterudite composition was determined by electron microprobe analysis. The dotted line represents the predicted variation in Ce filling assuming a simple solid solution system in the $CeFe_4 Sb_{12}$—$Ce_{0.065} Co_4 Sb_{12}$. The two solid lines respectively correspond to the predicted p-type to n-type conductivity transition for the systems $CeFe_4 Sb_{12}$—"NiSb$_3$" (Ni) and $CeFe_4 Sb_{12}$—$CoSb_3$ or $CeRu_4 Sb_{12}$—$CoSb_3$ (Co) with a valence electron count of 72. This assumes that Ni contributes four electrons to the total valence electron count.

Most of the filled skutterudite samples obtained to date possess p-type conductivity, however, a few n-type samples have been prepared in the $CeRu_4 Sb_{12}$—$CoSb_3$ system. This may be due to a decrease in Ce filling with increasing substitution of Fe or Ru by Co or Ni such that the valence count of 72 is slowly approached. Metallic compositions such as $CeFe_4 Sb_{12}$ are exclusively p-type materials.

Figure 5:
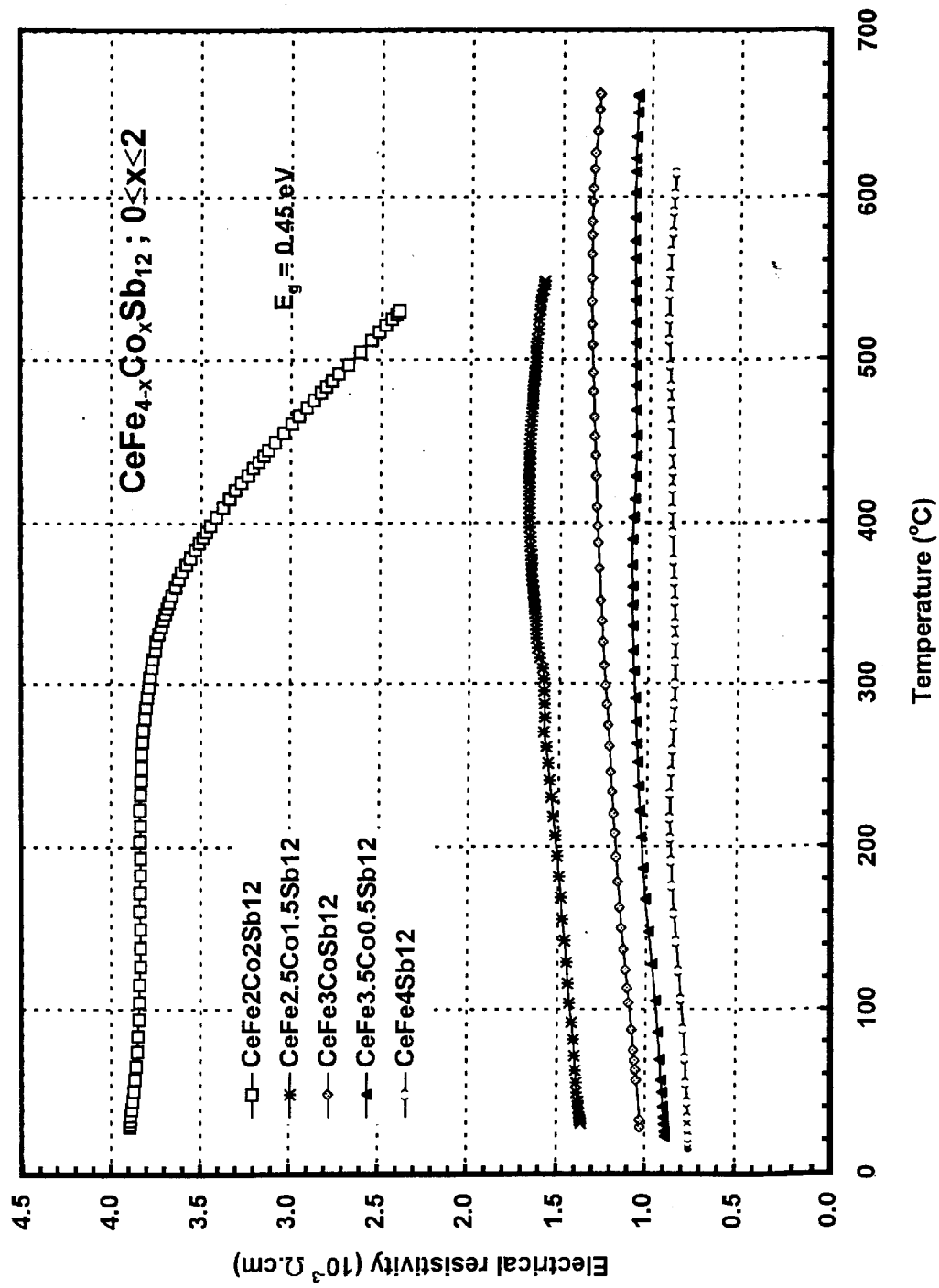
FIG. 5 is a chart showing the variations in the electrical resistivity with temperature for samples with different $CeFe_{4-x}Co_xSb_{12}$ compositions ($0 \leq x \leq 2$).
Figure 6:
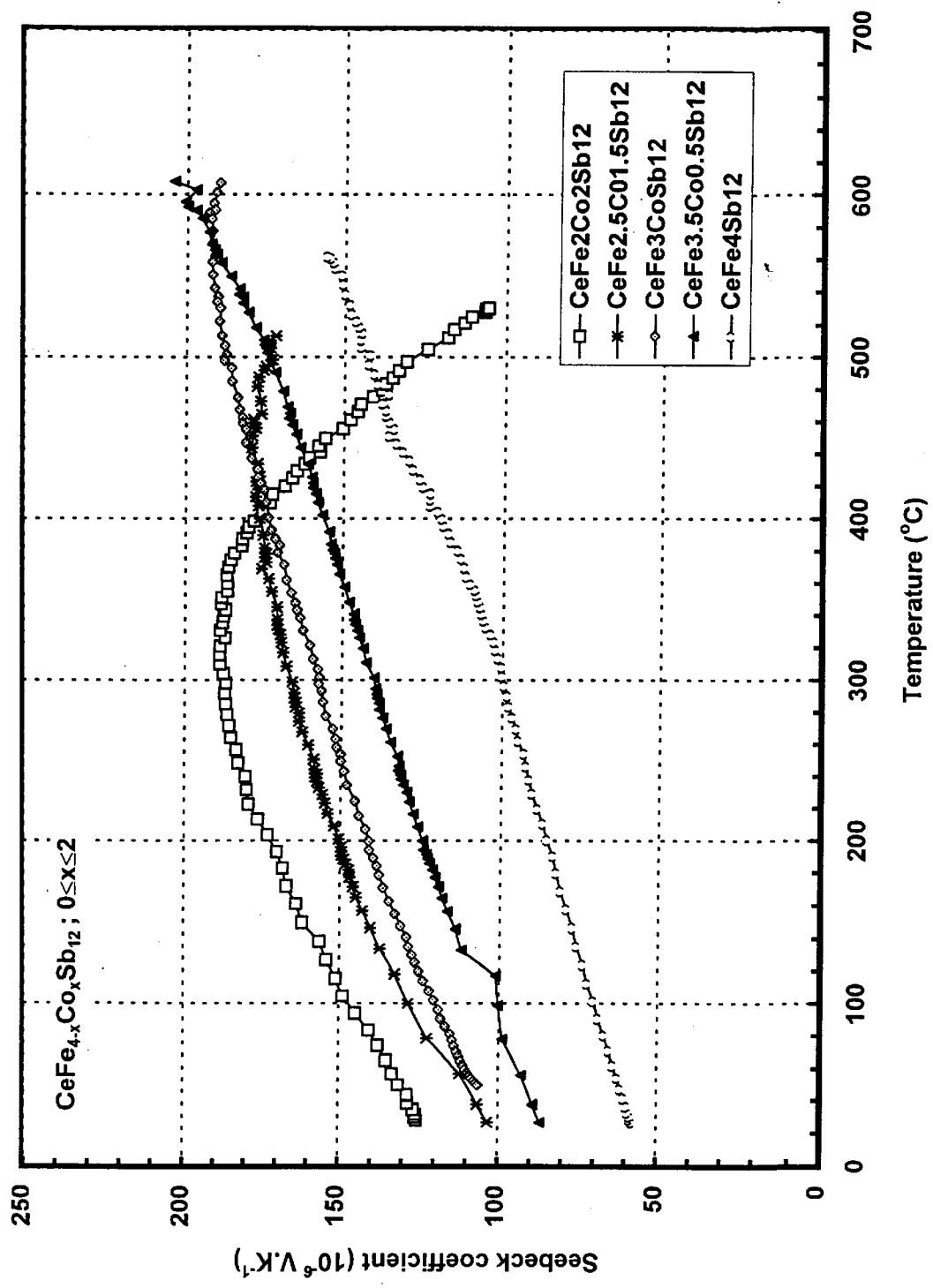
FIG. 6 is a chart showing variations in the Seebeck coefficient with temperature for samples with different $CeFe_{4-x}Co_xSb_{12}$ compositions ($0 \leq x \leq 2$).
Figure 7:
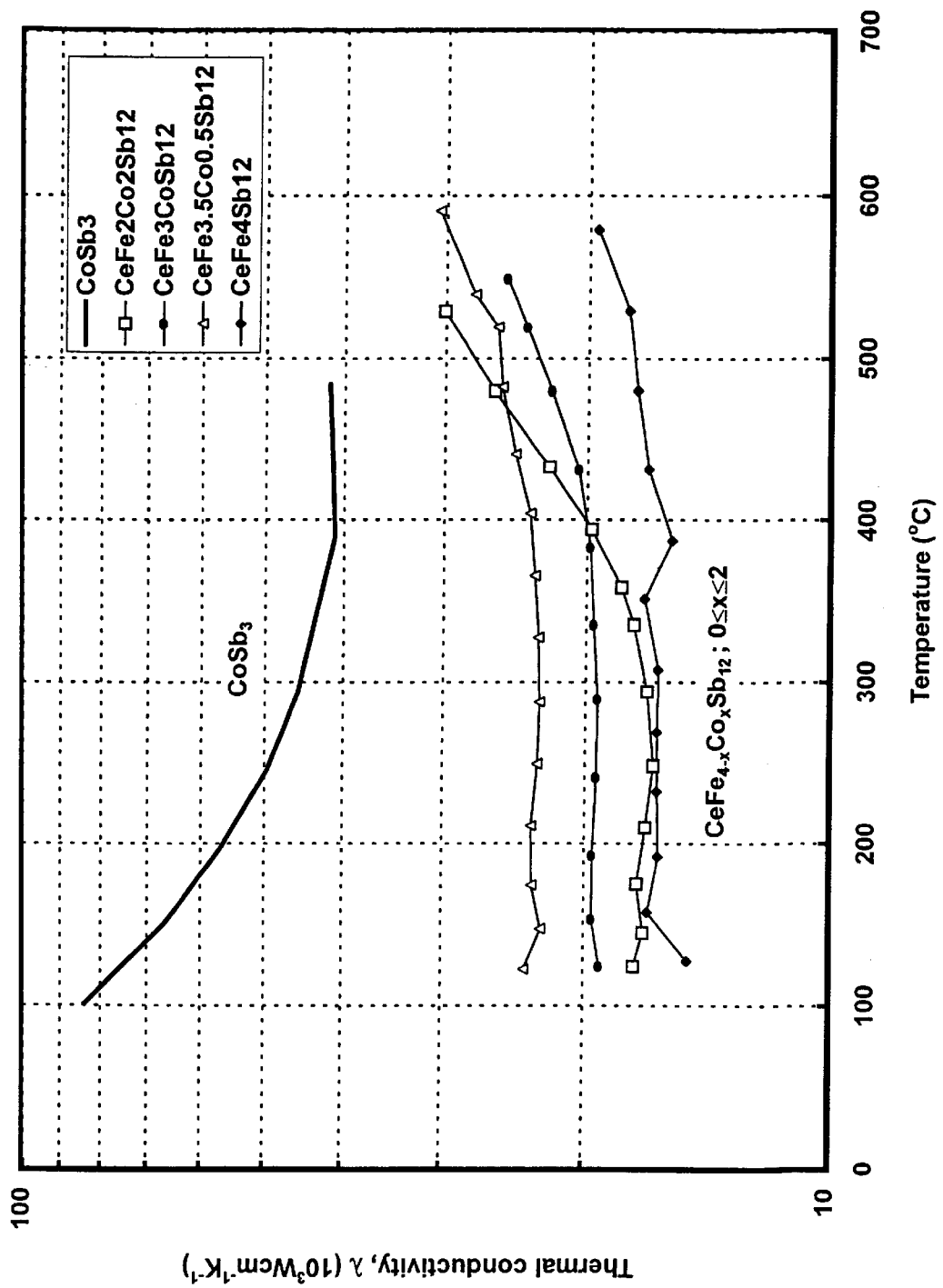
FIG. 7 is a chart showing variations in the thermal conductivity with temperature for samples with different $CeFe_{4-x}Co_xSb_{12}$ compositions ($0 \leq x \leq 2$). Results are compared to data for lightly doped p-type $CoSb_3$.

The electrical and thermal transport properties of the exemplary filled skutterudite compositions are plotted as a function of temperature in FIGS. 5 to 14. FIGS. 5, 6 and 7 respectively show the variations of the electrical resistivity, Seebeck coefficient and thermal conductivity with temperature for samples with different $CeFe_{4-x} Co_x Sb_{12}$ compositions ($0 \leq x \leq 2$) While samples with little or no Co are usually semimetallic, samples with a high concentration of Co content are usually semiconducting at elevated temperatures. The inventors measured a band gap energy of about 0.45 eV for the $Ce_{0.51} Fe_2 Co_2 Sb_{12}$ composition. One of the important characteristics of these samples is the unusually large Seebeck coefficient, even near room temperature. This large Seebeck coefficient, in addition to the sharp reduction in lattice thermal conductivity, significantly contributes to the high thermoelectric performance above 400° C. The thermal conductivity of filled skutterudite compositions in accordance with the invention is much lower than the value obtained for unfilled binary skutterudite compounds such as $CoSb_3$. The calculated lattice thermal conductivity is lowest for the $CeFe_{4-x} Co_x Sb_{12}$ compositions with no or little Co content. This is likely linked to both the high filling fraction and the high content in Fe.

Figure 8:
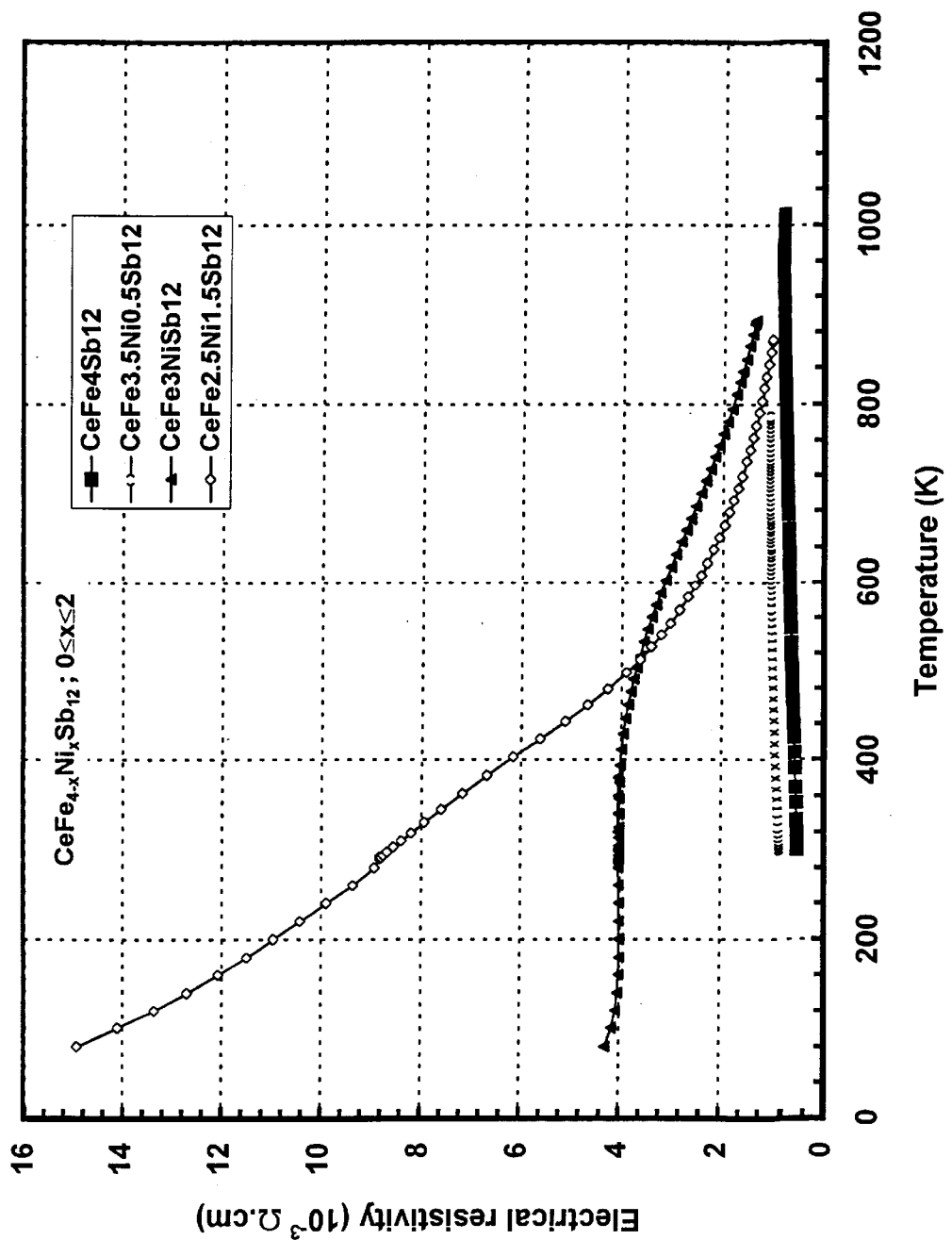
FIG. 8 is a chart showing variations in the electrical resistivity with temperature for samples with different $CeFe_{4-x}Ni_xSb_{12}$ compositions ($0 \leq x \leq 2$).
Figure 9:
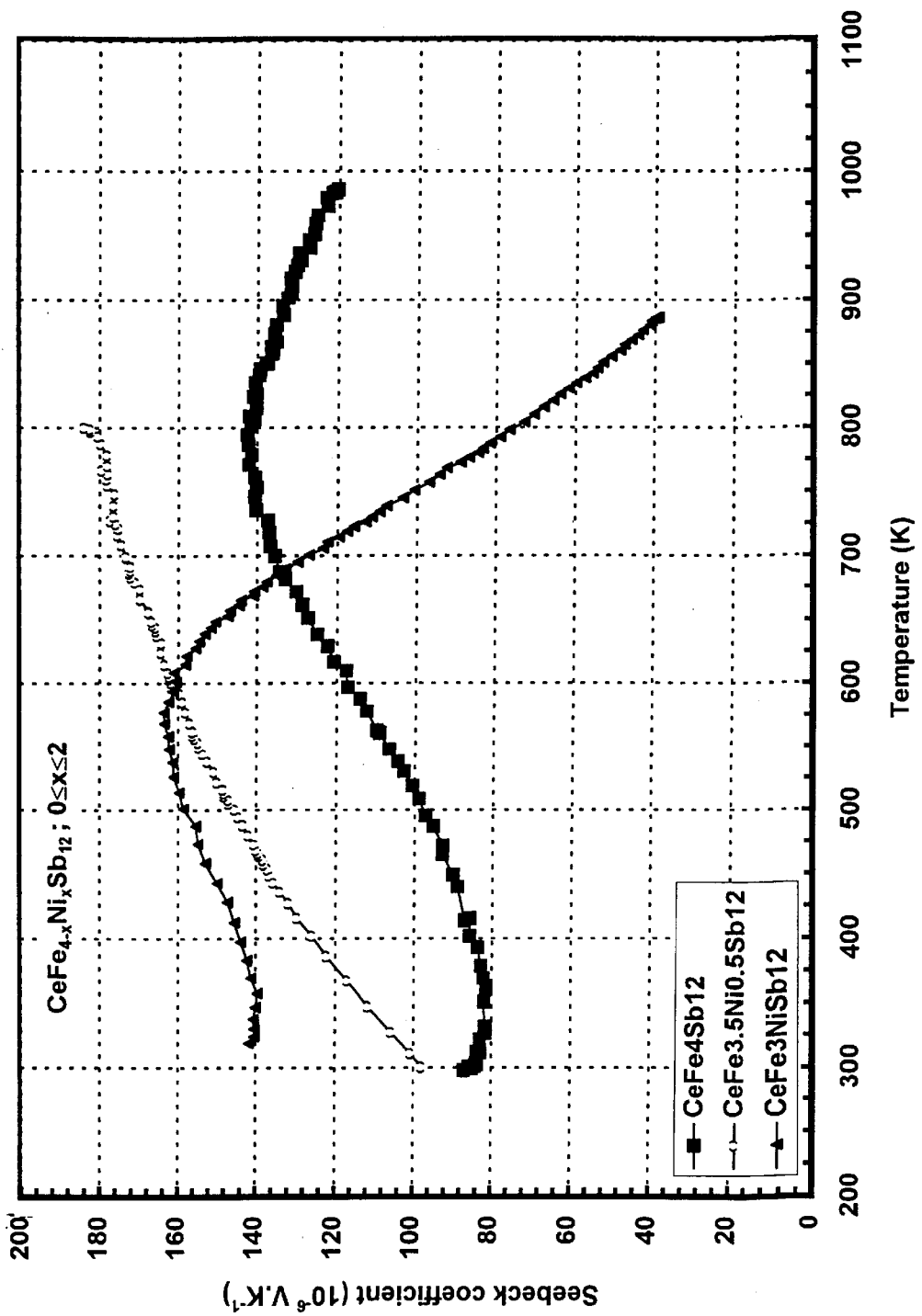
FIG. 9 is a chart showing variations in the Seebeck coefficient with temperature for samples with different $CeFe_{4-x}Ni_xSb_{12}$ compositions ($0 \leq x \leq 2$).
Figure 10:
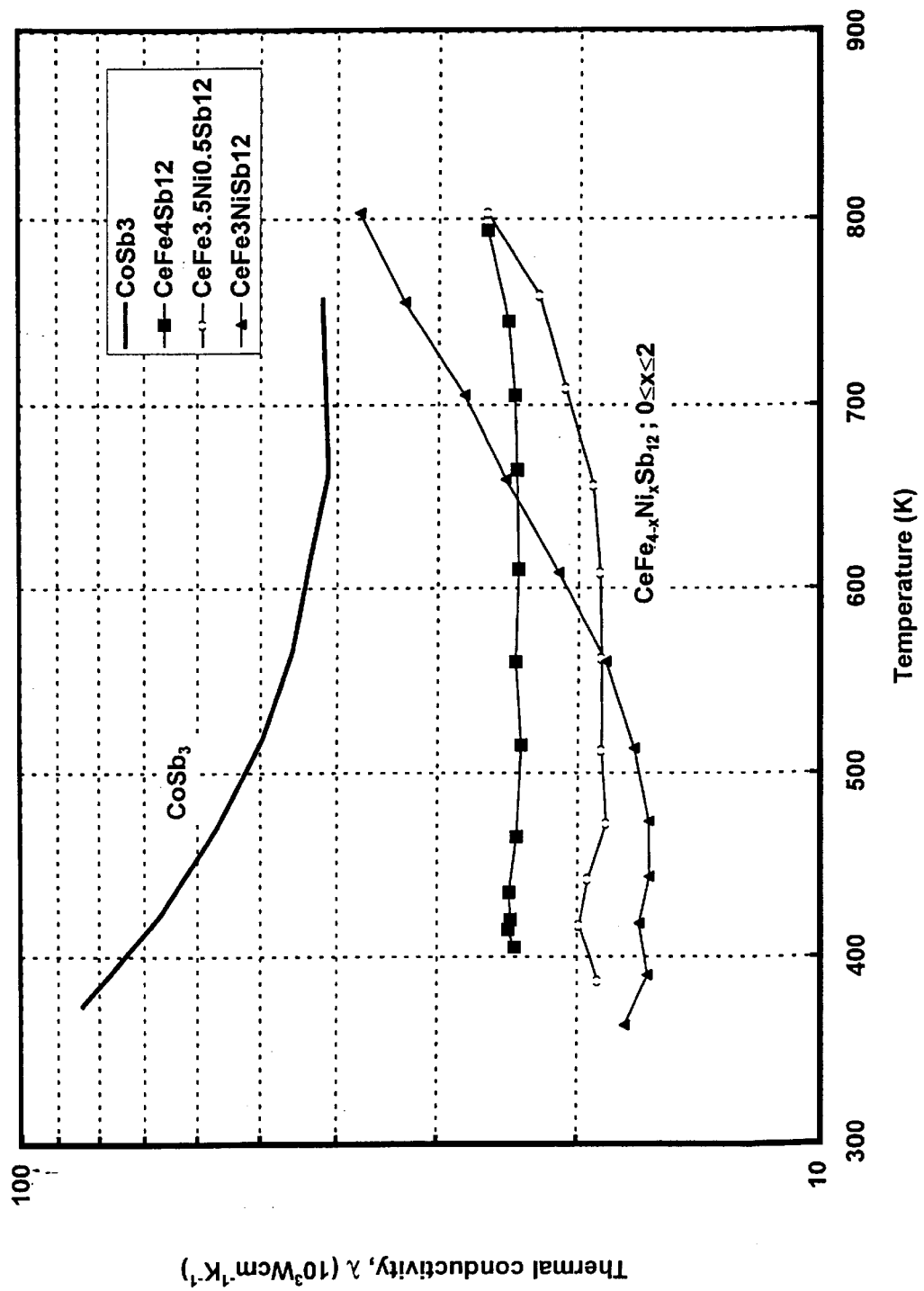
FIG. 10 is a chart showing variations in the thermal conductivity with temperature for samples with different $CeFe_{4-x}Ni_xSb_{12}$ compositions ($0 \leq x \leq 2$). Results are compared to data for lightly doped p-type $CoSb_3$.

The inventors obtained qualitatively similar results for samples with different $CeFe_{4-x} Ni_x Sb_{12}$ compositions ($0 \leq x \leq 2$). The variations of the electrical resistivity, Seebeck coefficient and thermal conductivity with temperature are shown in FIGS. 8, 9 and 10, respectively. A band gap value of about 0.49 eV was obtained for the semiconducting composition of $Ce_{0.6} Fe_3 NiSb_{12}$. The intrinsic behavior of this sample can be clearly seen for temperatures over 250° C.

Figure 11:
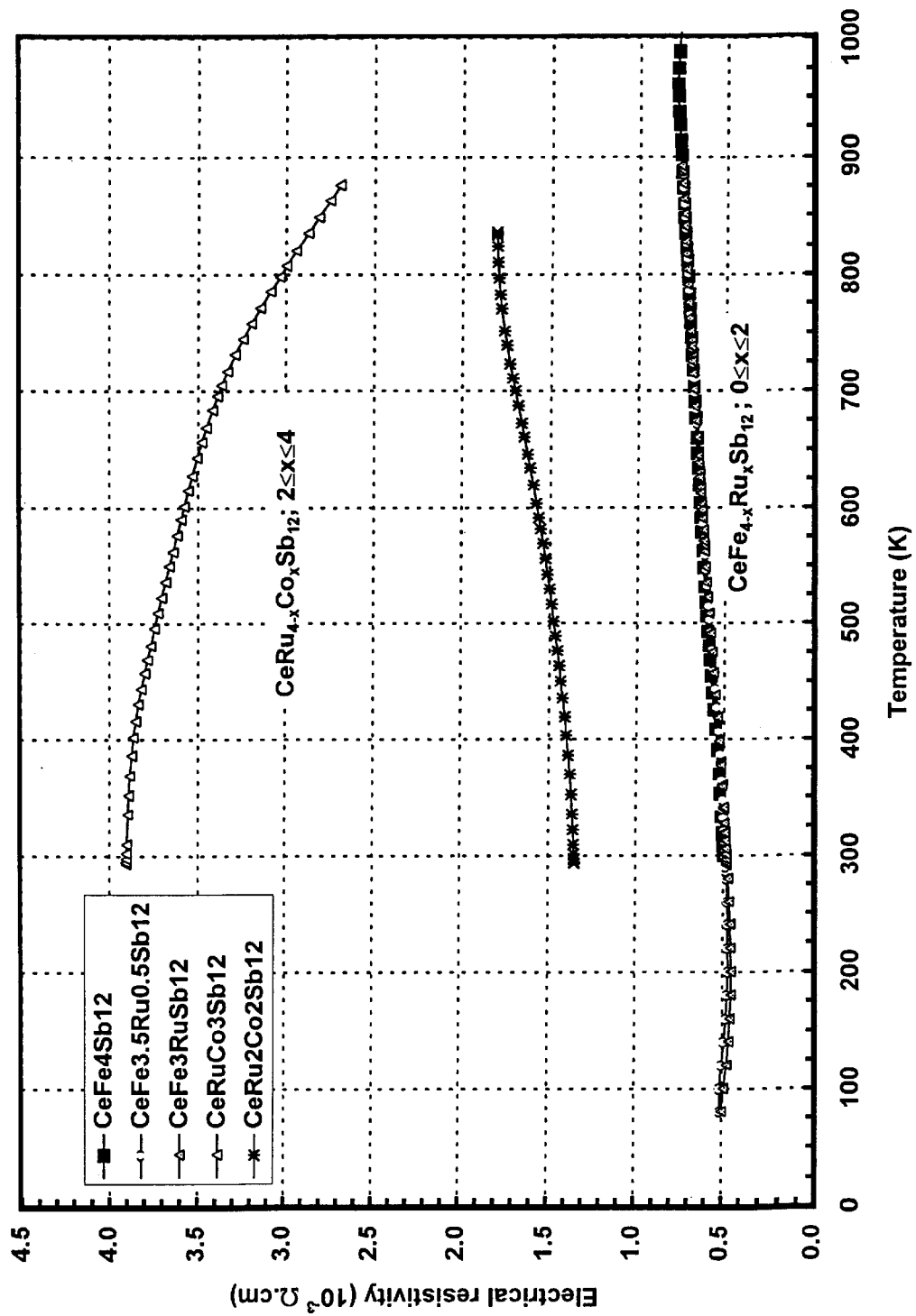
FIG. 11 is a chart showing variations in the electrical resistivity with temperature for samples with different $CeFe_{4-x}Ru_xSb_{12}$ ($0 \leq x \leq 2$) and $CeRu_{4-x}Co_xSb_{12}$ compositions ($2 \leq x \leq 4$).
Figure 12:
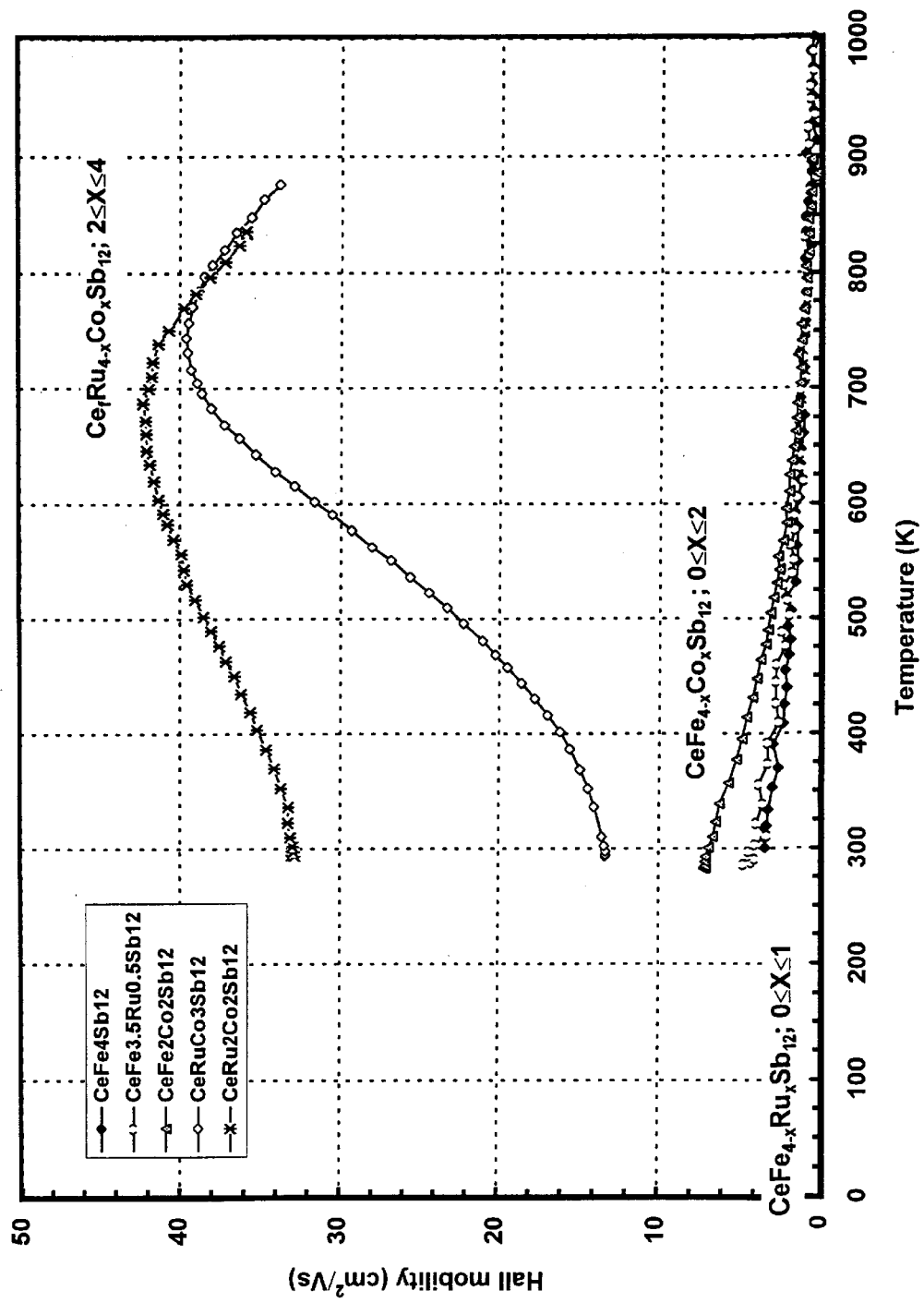
FIG. 12 is a chart showing variations in the Hall carrier mobility with temperature for samples with different $CeFe_{4-x}Ru_xSb_{12}$ ($0 \leq x \leq 1$), $CeFe_{4-x}Co_xSb_{12}$ ($0 \leq x \leq 2$) and $CeRu_{4-x}Co_xSb_{12}$ compositions ($2 \leq x \leq 4$).
Figure 13:
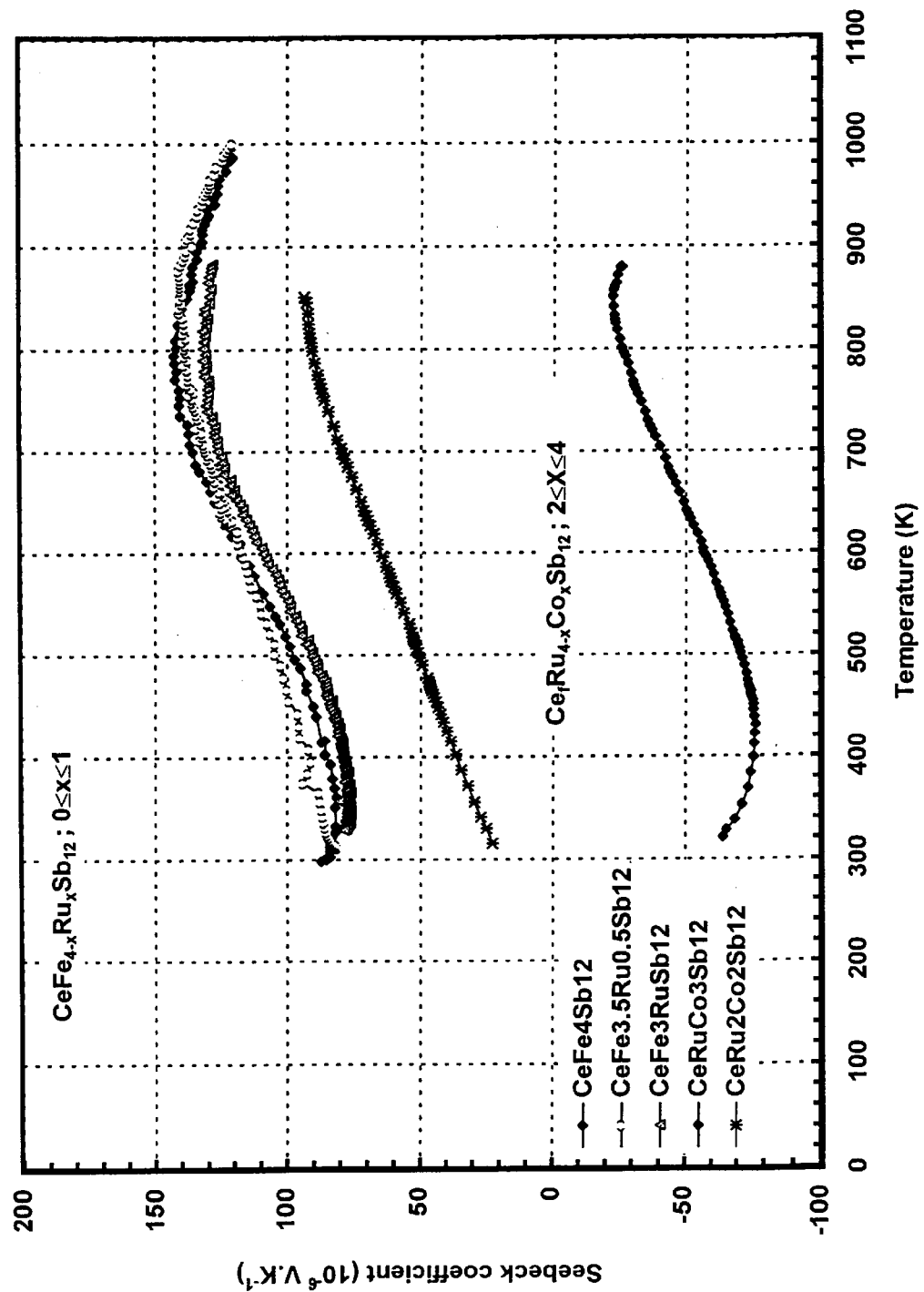
FIG. 13 is a chart showing variations in the Seebeck coefficient with temperature for samples with different $CeFe_{4-x}Ru_xSb_{12}$ ($0 \leq x \leq 1$) and $CeRu_{4-x}Co_xSb_{12}$ compositions ($2 \leq x \leq 4$).
Figure 14:
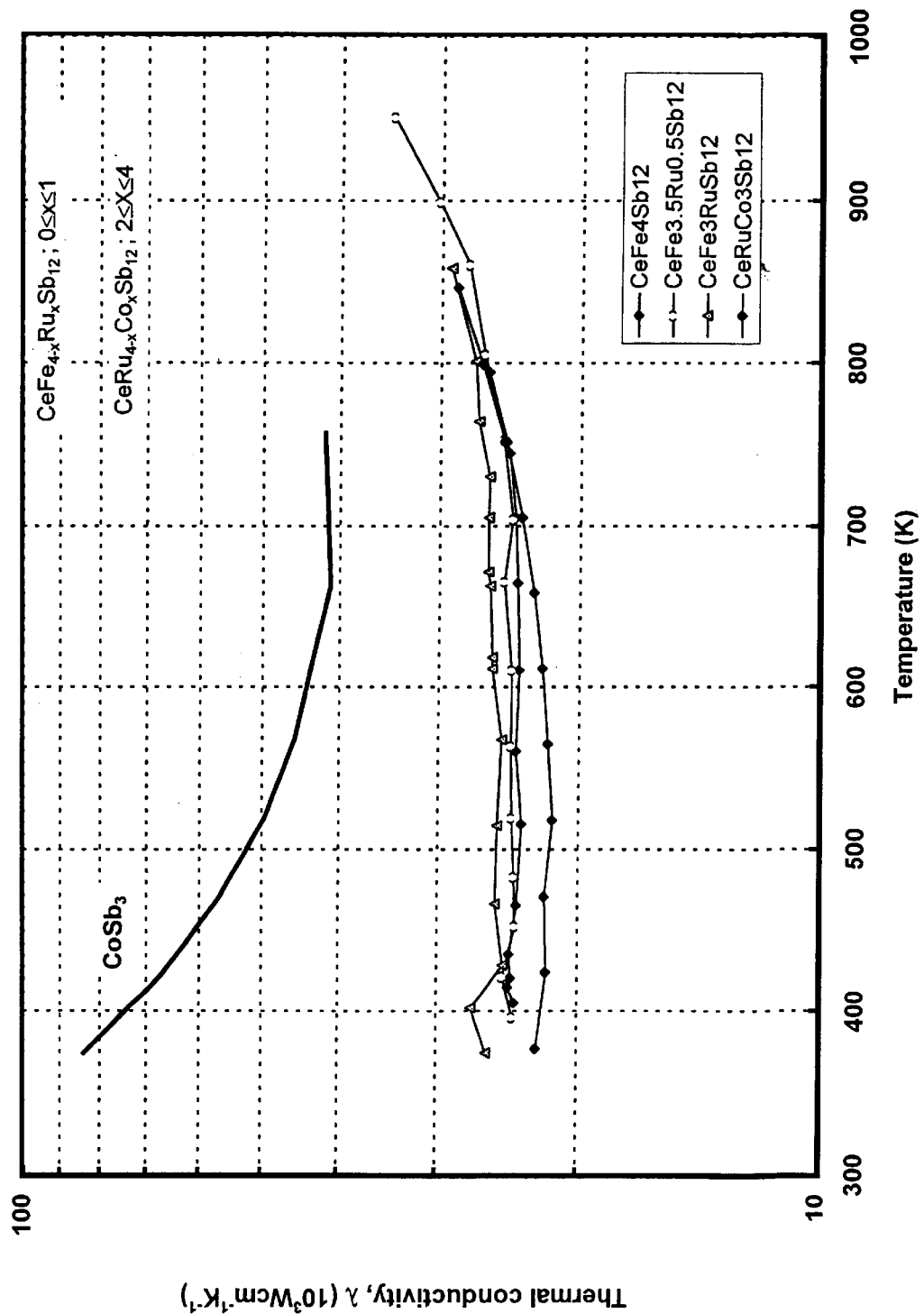
FIG. 14 is a chart showing variations in the thermal conductivity with temperature for samples with different $CeFe_{4-x}Ru_xSb_{12}$ ($0 \leq x \leq 1$) and $CeRu_{4-x}Co_xSb_{12}$ compositions ($2 \leq x \leq 4$) Results are compared to data for lightly doped p-type $CoSb_3$.

Different results are obtained in $CeFe_{4-x} Ru_x Sb_{12}$ and $CeRu_{4-x} Co_x Sb_{12}$ systems. FIGS. 11, 13 and 14 respectively show the variations of the electrical resistivity, Seebeck coefficient and thermal conductivity with temperature for samples with different $CeFe_{4-x} Ru_x Sb_{12}$ ($0 \leq x \leq 1$) and $CeRu_{4-x} Co_x Sb_{12}$ compositions ($2 \leq x \leq 4$). FIG. 12 plots the variations of the Hall carrier mobility with temperature for samples with different $CeFe_{4-x} Ru_x Sb_{12}$ ($0 \leq x \leq 1$) $CeFe_{4-x} Co_x Sb_{12}$ ($0 \leq x \leq 2$) and $CeRu_{4-x} Co_x Sb_{12}$ compositions ($2 \leq x \leq 4$). Almost all samples prepared in the $CeFe_{4-x} Ru_x Sb_{12}$ system show similar thermoelectric properties to the pure $CeFe_4 Sb_{12}$ composition. The difference in thermoelectric properties becomes more apparent at low temperatures (e.g., below 600 C.°) where the electrical resistivity of the samples containing Ru shows an activated behavior, suggesting the opening of a band gap.

One surprising result is that no significant changes in the lattice thermal conductivity are observed by the substitution of Fe by bigger and heavier atom Ru. This may be interpreted by assuming that the presence of both the filling atoms, Ce, and the transition metal, Fe, causes scattering of phonons in the range of wavelengths covered by Ru point defect scattering. This result differs from the data obtained in the $CeRu_{4-x} Co_x Sb_{12}$ system, where semiconducting samples have been characterized.

Some p-type and n-type samples have been obtained so far but the important difference lies in the large value of the carrier mobility, as seen in FIG. 12. The $Ce_{0.2} RuCo_3 Sb_{12}$ and $Ce_{0.6} Ru_2 Co_2 Sb_{12}$ samples have carrier mobility one order of magnitude larger than that of the Fe-containing filled skutterudite compositions. However the p-type Seebeck values are much lower and comparable to the predicted values for a heavily doped $CoSb_3$ sample. This demonstrates that truly semiconducting filled skutterudite compositions can be prepared by the present invention.

Figure 15:
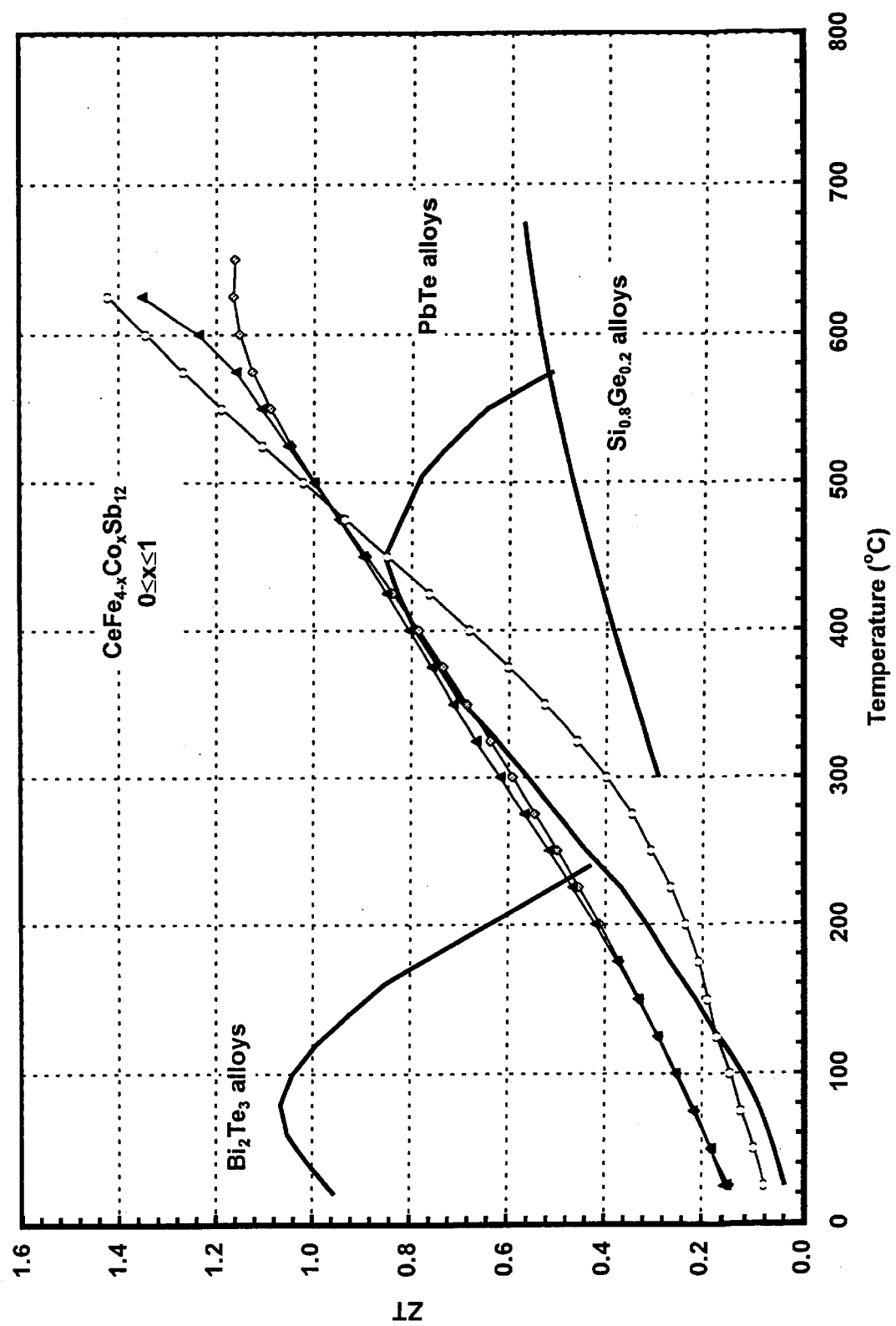
FIG. 15 is a chart showing variations in the calculated dimensionless figure of merit ZT with temperature for samples with different $CeFe_{4-x}Co_xSb_{12}$ compositions ($0 \leq x \leq 1$). Results are compared to data for state of the art thermoelectric materials $Bi_2Te_3$ alloys, PbTe alloys and $Si_{0.8}$—$Ge_{0.2}$ alloys.

The inventors measured large values of the figure of merit ZT for compositions close to $CeFe_4 Sb_{12}$ at high temperatures. For example, a ZT value of about 1.4 was obtained at about 600° C. As shown in FIG. 15, this ZT value is much higher than the results obtained for state of the art thermoelectric materials in this temperature range (ZT~0.85 at about 450° C.).

The thermoelectric properties of the filled skutterudite materials in accordance with the invention may be further improved. For example, the following effects may be used for such improvement.

(1) Effect of changing the filling fraction and introducing several filling atoms. It may not be necessary to fully fill the empty octants in the skutterudite structure to obtain the bulk of the decrease in lattice thermal conductivity. In addition, by changing the filling fraction, there is more flexibility in tailoring the transport properties (that is, adjusting the valence electron count). Introducing several filling atoms with different valence, masses and volumes may likely result in increased scattering of phonons across a large range of wavelengths and thus cause additional reduction in the lattice thermal conductivity.

(2) Effect of substituting different atoms on the transition metal site. The inventors have observed the peculiar effect of Fe on the transport properties. Filled skutterudite compositions containing Fe usually have metallic to semimetallic behavior and may be optimized to achieve efficient thermoelectric conversion at high temperatures. When Ru is used to replace Fe, filled skutterudite compounds become semiconducting and both p-type and n-type semiconducting behavior can be obtained. It is easier to optimize the properties of the Ru-based compositions for application at different temperature ranges, in particular at low temperatures. This is at least in part because the present invention allows user control over carrier concentration and consequently the electric conductivity and Seebeck coefficient may also be controlled. Mixing atoms such as Co and Ru at a metal site can be used to enhance the point defect scattering effects which reduce the lattice thermal conductivity and increases the figure of merit ZT. Moreover, the addition of some small amount of Fe may be used to achieve a higher Seebeck coefficient and a lower lattice thermal conductivity. Finally, this substitution on the metal site can help control the valence electron count.

(3) Effect of substituting different atoms on the pnicogen site. Substituting different atoms at a pnicogen site can be used to control the doping level and thus the valence electron count, (for example replacing Sb by Sn or Te) or to introduce point defect scattering (for example replacing Sb by As) or both at the same time (for example replacing Sb by Se). In addition, the size of the empty octants or cages can be shrunk by replacing the larger Sb by smaller atoms As or P. This in turn controls the size of the filling atom.

As stated previously, those three approaches can be combined to optimize the thermoelectric transport properties allowing fine control of the carrier concentration, band gap, and lattice thermal conductivity.

Preparation Techniques

The filled skutterudite samples as described thereabove and their variations may be prepared by a two-step process. The first step includes preparation of a pellet precursor with nominal compositions including a filling element (e.g., rare earth elements) and transition metals. An induction furnace is preferred for this process though any other processes that can produce the needed high temperatures and rapid cooling mechanism ("quenching") such as an arc melting technique can also be used. The second step involves mixing the precursor with pnicogen powder (e.g., antimony powder), subsequentially melting or sintering the mixture, and finally annealing the mixture at about 500~1000° C. and more preferably between 600~800° C. The resulting powder can then be hot pressed at a pressure at about 15,000 psi or higher (e.g., 20,000 psi). This method of synthesizing filled skutterudite materials can be efficient and economical. It is particularly useful for manufacturing a large quantity of such materials.

This two-step preparation method can be used to make many different skutterudite compositions in accordance with the present invention. The following are samples that were prepared with this method. First, pellet precursors with following nominal compositions were prepared: $Ce_fFe_{4-x}Co_x$, $Ce_fFe_{4-x}Ni_x$, $Ce_fFe_{4-x}Ru_x$, $Ce_fRu_{4-x}Co_x$, $Nd_fFe_{4-x}Co_x$, $Th_fRu_{4-x}Co_x$, $Ce_fCo_{4-x}Ir_x$, and $Ce_fMn_{4-x}Co_x$, where $0 \leq f \leq 1$. Using the proper stoichiometric ratios, high purity elements such as Ce, Fe and/or Co, Ni, Ru elements were mixed and melted in a boron nitride crucible at temperatures over 1200° C. in vacuum by an induction furnace. Upon visually observing the melting, the melt of the high purity elements (e.g., Ce—Fe—Co) was cooled down, resulting in the formation of compounds and phases such as $Ce_xFe_yCo_z$. Then, pnicogen elements such as Sb were added and mixed with the compounds (e.g., $Ce_xFe_yCo_z$), and the sample was melted or sintered at elevated temperatures.

To complete the reaction and formation of the filled skutterudite structure, the resulting pellets were annealed for a period of at least 24 hours (e.g. a few days) at a temperature range of about 500~1000° C. and more preferably between 600~800° C.

X-ray diffraction analysis is then performed on the prepared samples to examine whether or not the resulting powders are in a single phase ("purity") and to further test their characteristics. Measured results by the inventors clearly showed the filled skutterudite patterns. In some cases, the presence of some small amounts of secured phases can be seen, such as free Sb, or Fe, Ni and Ru diantimonides. The above-prepared pellets were then ground and hot-pressed preferably at about 600° C. to 650° C. under a pressure of at least about 15,000 psi and preferably about 19,500 psi in an inert argon atmosphere, resulting in filled skutterudite samples with a mass density of about 98% of their theoretical value calculated from the X-ray diffraction analysis. Typical results of electron microprobe analysis ("MPA") of the samples indicated that the single phase skutterudite compositions are about 95% to 99% in volume of the samples.

Alternatively, the filled skutterudite compositions indicated in formula (4) may also be prepared by annealing mixtures of powders of R, $\overline{R}$, T, $\overline{T}$, Pn, and $\overline{Pn}$ at temperatures approximately between 400 and 800° C. This may be done by the following three steps. First, the powders are mixed together, for example, in plastic vials using a mechanical mixer. Second, the mixture is loaded into quartz ampoules which are subsequently evacuated and sealed. Third, the ampoules are placed in an isothermal annealing furnace and maintained at a temperature between 400 and 800° C. for about five days.

In addition, filled compositions may be prepared by first reacting the "filling" element, R, with a pnicogen element, Pn, by using, for example, a RF arc-melting furnace. Next, metallic elements are added to the pre-reacted R-Pn precursors and mixed. Then the mixture is annealed at temperatures approximately between 600 and 800° C. to form the desired filled skutterudite composition.

New Thermoelectric Devices

One important aspect of the present invention is incorporation of the filled skutterudite materials of the invention in a variety of thermoelectric devices. Most conventional thermoelectric devices such as electrical power generators have been either very difficult to materialize or too expansive to be practical for many applications. The present invention can be used to manufacture high-efficiency thermoelectric devices at relatively low cost and to adapt their properties to different applications.

Figure 16:
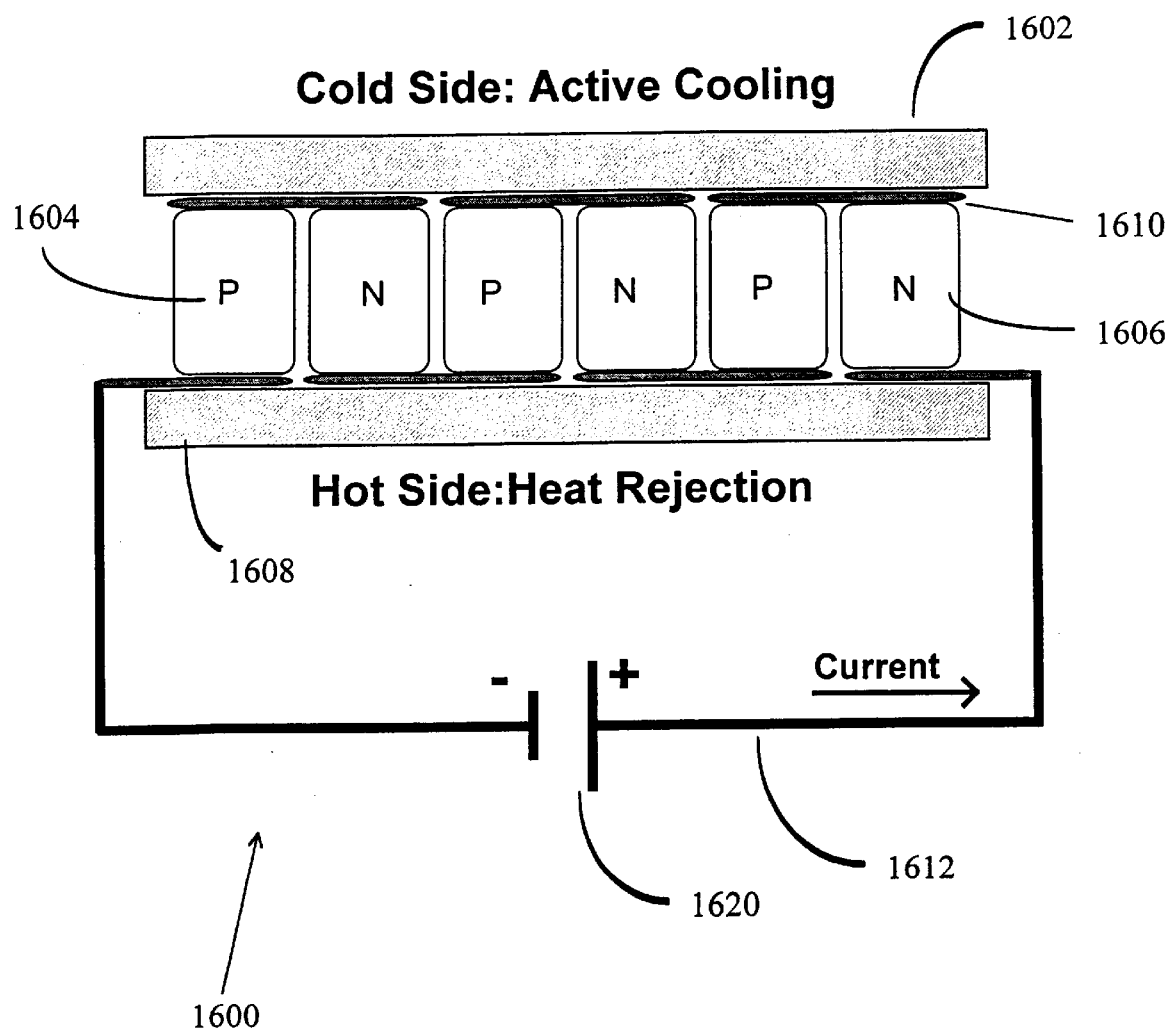
FIG. 16 is a diagram illustrating the basic structure of a thermoelectric cooler using filled skutterudite materials in accordance with the present invention.

FIG. 16 shows a schematic of a thermoelectric cooler 1600 that uses the new filled thermoelectric skutterudites in accordance with the present invention. The cooler 1600 has a hot side that is in part defined by a plate or substrate 1602 and a cold side that is in part defined by a plate or substrate 1608. Plates 1602 and 1608 are frequently made of ceramic materials that are electrical insulators. A plurality of thermoelectric elements are sandwiched between the plates 1602 and 1608. Each element has two pieces of thermoelectric filled skutterudite materials with opposite type of carriers, a p-type piece 1604 and a n-type piece 1606. The piece 1604 and the piece 1606 are directly connected with each other electrically on one side and indirectly connected with each other through other thermoelectric elements and the circuit on the other side. Conductors 1610 are used to provide an electrical conduit between any two adjacent thermoelectric pieces 1604 and 1606. Two adjacent thermoelectric elements are electrically connected in series, i.e., a p-type piece 1604 of one element is directly connected to a n-type piece 1606 of a neighboring element or vice versa.

The cooler 1600 has a DC circuit 1612 to electrically connect all thermoelectric elements. The circuit 1612 has its negative side connected with a p-type piece 1604 on the hot side (plate 1608) and the positive side connected with a n-type piece, also on the hot side (plate 1608). A DC power supply 1620 sends an electrical current to flow through all the thermoelectric elements in series with its direction in each element from the n-type piece 1606 to the p-type piece 1604. The holes in the p-type piece 1604 move in the direction of the current and the electrons in the n-type piece 1606 moves against the direction of the current. Therefore, the electrical current from the DC power supply 1620 makes both holes and the electrons move away from the cold side (plate 1602) and towards the hot side (plate 1608). The thermal energy of the cold side (plate 1602) are thus transferred to the hot side (plate 1608) by the holes and electrons. As a result, the heat of the cold side (plate 1602) is "pumped" and dumped to the hot side (plate 1608). A maximal cooling efficiency is achieved by minimizing the temperature difference between the hot side and cold side and importantly by using filled skutterudites with large ZT values.

Figure 17:
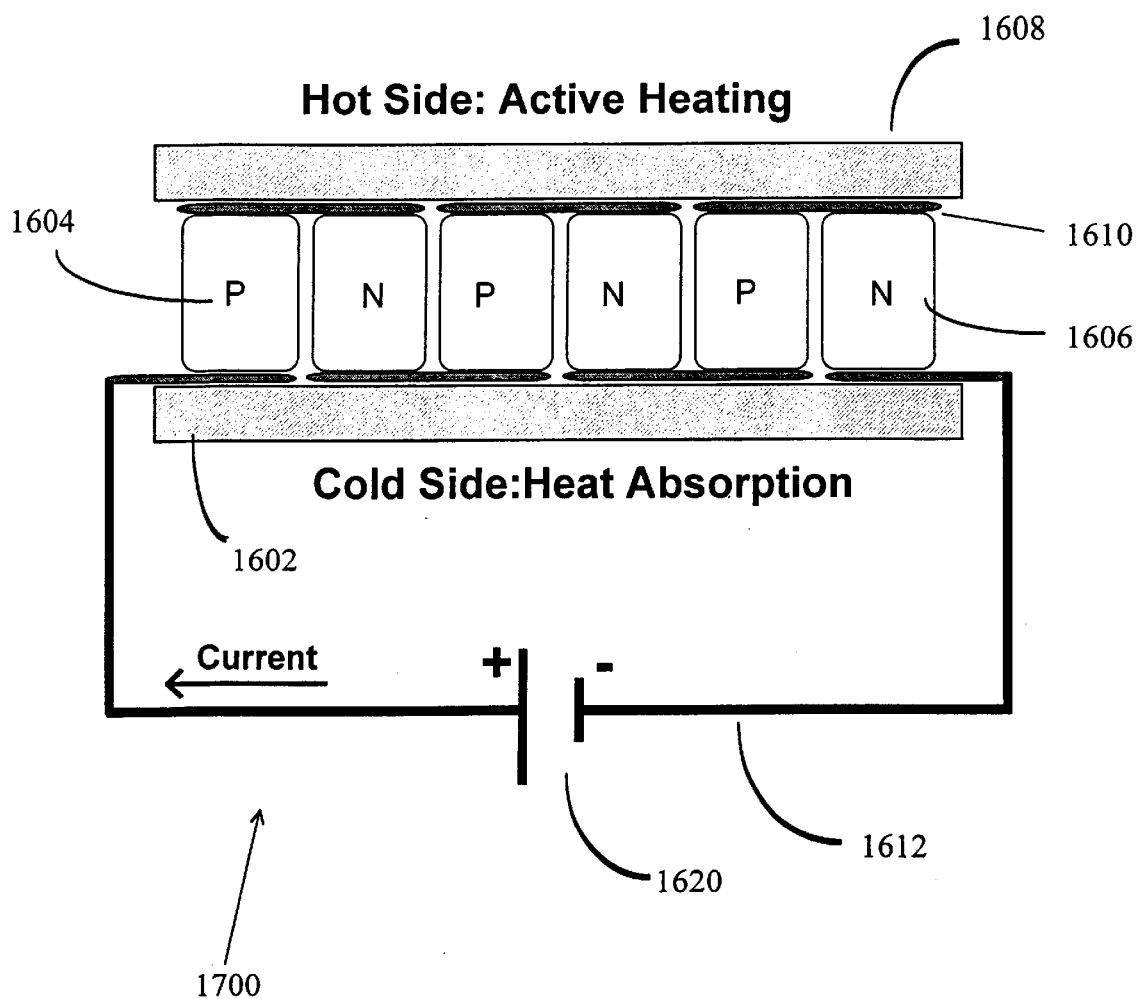
FIG. 17 is a diagram illustrating the basic structure of a thermoelectric heat pump using filled skutterudite materials in accordance with the present invention.

FIG. 17 shows a schematic of a thermoelectric heater 1700 that uses both n-type and p-type filled skutterudites in accordance with the present invention. The heater 1700 is similar to the cooler 1600 in structure but the hot side and the cold side are exchanged. The driving electrical current in each thermoelectric element of the heater 1700 flows from the p-type piece 1604 to the n-type piece 1606, opposite to the current direction in the cooler 1600. The heat of the cold side is transferred to the hot side for heating.

Figure 18:
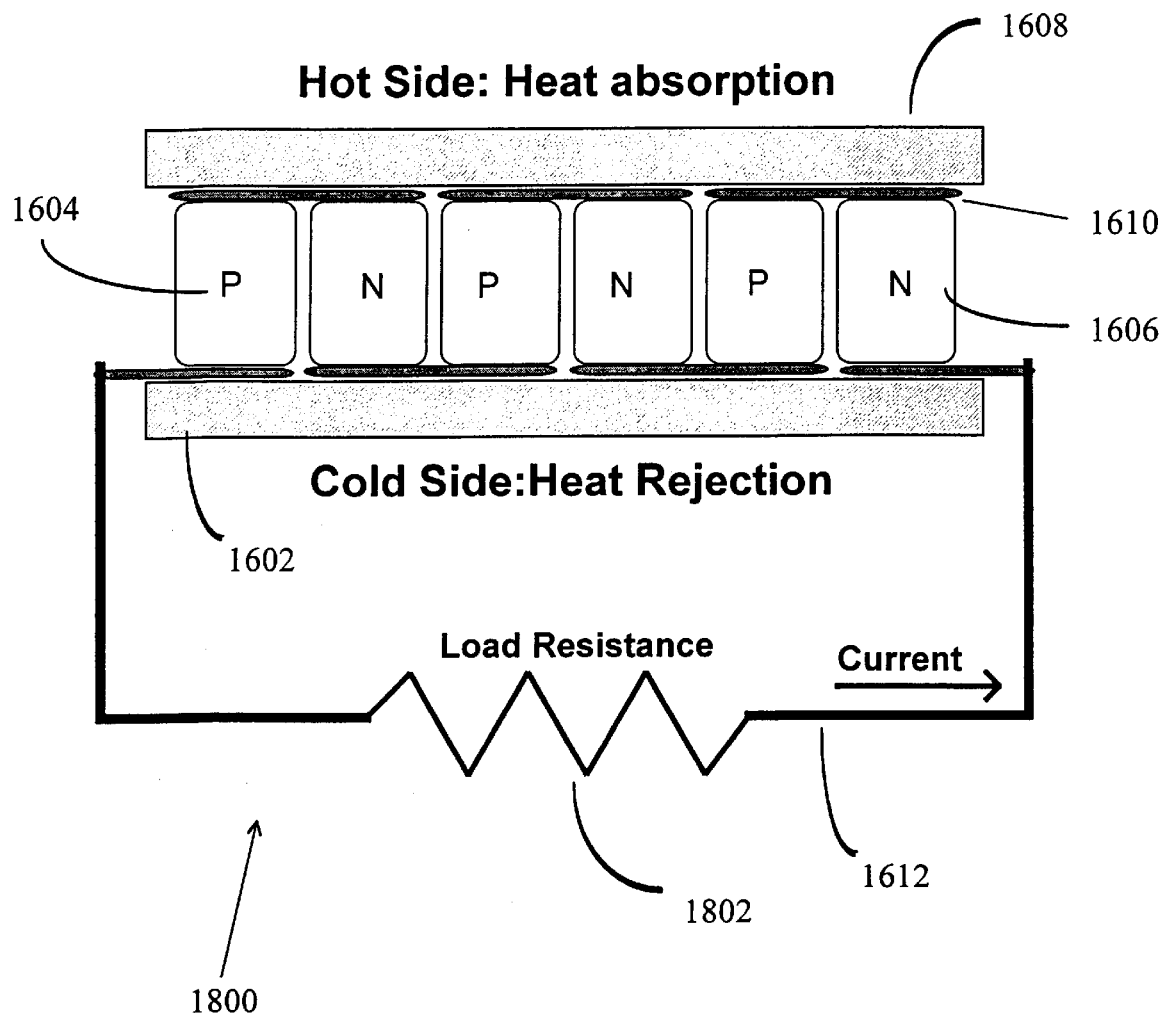
FIG. 18 is a diagram illustrating the basic structure of a thermoelectric power generator using filled skutterudite materials in accordance with the present invention.

A thermoelectric power generator 1800 is shown in FIG. 18. The hot side (plate 1608) is in contact with a heat source of high temperature $T_h$. The cold side (plate 1602) is in contact with a heat dumper of low temperature $T_c < T_h$. The temperature gradient from the hot side to the cold side makes the carriers in the thermoelectric pieces 1604 and 1606 move away from the hot side and towards the cold side. An electrical current is thus generated in each thermoelectric element in a direction from the n-type piece 1606 to the p-type piece 1604. The electrical power generation is increased by increasing the temperature difference and by using filled skutterudites of large ZT values.

The properties of the new filled skutterudites can be designed or engineered by using different rare earth filling atoms, or by using different substituting transition metals and main-group elements or combining all the techniques thereabove. Such unique versatility of the present invention not only allows obtaining filled skutterudites with large ZT values for various thermoelectric devices but also allows fabrication of an efficient filled skutterudite with its properties tailored for a specific application, e.g, having optimal performance at a desired temperature range. For example, filled skutterudites $Ce_f Fe_{4-x-y} Ru_x Ni_y Sb_{12}$ (where $0 \leq x \leq 4$, $0 \leq y \leq 4$, and $0 \leq x+y \leq 4$) in accordance with the present invention can be used to make both n-type and p-type thermoelectric materials for power generation at high temperatures.

The filled thermoelectric skutterudite materials could also be used in thermoelectric sensing applications. Some thermoelectric sensors that can take advantages of the filled skutterudites in accordance with the present invention are described by R. Fettig in *Proceedings of XV International Conference on Thermoelectrics,* IEEE Catalog number 96TH8169, p. 315 (1996).

The inventors of the present invention also contemplate that the filled skutterudite thermoelectric materials of either n-type or p-type can be used in combination with other kinds of thermoelectric materials in a thermoelectric device. For example, a n-type filled skutterudite material in accordance with the present invention can be used as the n-leg of a thermoelectric device while another p-type material such as TAGS can serve as the p-leg of the device. Such combination may be used to meet the requirements of some specific applications.

The thermoelectric materials according to the present invention can be configured to have superior thermoelectric properties at high temperatures in comparison with conventional thermoelectric materials. These materials are part of the large family of skutterudites, a class of compounds which have shown a great potential for application to solid state devices using thermoelectric energy conversion. The composition of these new materials is mainly derived from the skutterudite crystal structure having transition metal atoms and pnicogen atoms. In these compounds, the empty octants of the skutterudite structure are filled with one or more heavy elements such as rare-earth elements Ce, Nd or La. Samples of these compositions prepared by a combination of melting/sintering and powder metallurgy techniques have shown exceptional thermoelectric properties in the 350–700° C. temperature range. Both p-type and n-type conductivities have been obtained. Measurements on bulk samples with a $CeFe_{3.5}Co_{0.5}Sb_{12}$ atomic composition and p-type conductivity resulted in dimensionless figure of merit ZT values of up to 1.4 at 600° C. A number of such filled skutterudites can be used to achieve high ZT values at a desired operating temperature by manipulating the composition and doping. Various techniques for preparing novel filled skutterudite compositions are disclosed herein to allow engineering a filled skutterudite with thermoelectric properties tailored for a specific application. The present invention presents a breakthrough that leads to governmental and industrial use of these new materials in much more efficient thermoelectric devices (generators, coolers and detectors), thus substantially expanding their range of applications, and generating renewed interest in the field of thermoelectrics.

Although the present invention has been described in detail with reference to a number of particular embodiments, one ordinarily skilled in the art to which this invention pertains will appreciate that various modifications and enhancements may be made without departing from the spirit and scope of the following claims.

What is claimed is:

1. A thermoelectric device, comprising:
   a first substrate at a first temperature;
   a second substrate at a second temperature, said second temperature being different from said first temperature to form a temperature gradient across said first substrate and said second substrate;

at least one piece of p-type thermoelectric material disposed between said first substrate and said second substrate, having a first end surface in thermal contact with said first substrate and a second end surface in thermal contact with said second substrate;

at least one piece of n-type thermoelectric material disposed between said first substrate and said second substrate relative to said p-type thermoelectric material, having a first end surface in thermal contact with said first substrate and a second end surface in thermal contact with said second substrate;

at least one of said p-type thermoelectric material and said n-type thermoelectric material having a filled skutterudite lattice structure;

an electrical conducting element, disposed to electrically connect said first surface of said p-type thermoelectric material with said first surface of said n-type thermoelectric material to provide a first electrical conduit therebetween;

an electrical circuit, having a first terminal and a second terminal, said first terminal connecting to said second surface of said p-type thermoelectric material, said second terminal connecting to said second surface of said n-type thermoelectric material, said electrical circuit operating to provide a second electrical conduit between said p-type thermoelectric material and said n-type thermoelectric material;

said p-type thermoelectric material, said electrically conducting element, said n-type thermoelectric material, and said electrical circuit forming an electrical loop to have an electrical current therein; and said p-type thermoelectric material and said n-type thermoelectric material operating to correlate said electrical current with said temperature gradient.

2. A thermoelectric device as in claim 1, wherein said skutterudite lattice structure comprises:

a plurality of transition metal atoms from at least one transition metal element selected from the eighth, ninth, and tenth columns of the periodic table;

a plurality of non-metal atoms from at least one non-metal element selected from the fourteenth, fifteenth, and sixteenth columns of the periodic table;

a crystal lattice structure, having a unit cubic cell of eight octants disposed relative to each other to form said unit cubic cell, said unit cell having twenty-four of said non-metal atoms and eight of said transition metal atoms, said twenty-four non-metal atoms forming six quadrilaterally planar rings with each being located in six of said eight octants;

a plurality of filling atoms from at least one filling element that is different from said transition metal element and said non-metal element, two of said filling atoms being disposed in two of said eight octants that are not occupied by said planar rings; and said twenty-four non-metal atoms, said eight transition metal atoms, and said two filling atoms being so selected with respect to each other that said solid-state compound is semiconducting or semimetallic.

3. A thermoelectric device as in claim 2, wherein said electrical circuit further comprises a DC power supply, operating to drive said electrical current to flow in a direction from said n-type thermoelectric material to said p-type thermoelectric material, thus resulting a transfer of thermal energy from said first substrate to said second substrate.

4. A thermoelectric device as in claim 2, wherein said electrical circuit further comprises a DC power supply, operating to drive said electrical current to flow in a direction from said p-type thermoelectric material to said n-type thermoelectric material, thus resulting in a transfer of thermal energy from said second substrate to said first substrate.

5. A thermoelectric device as in claim 2, wherein said first temperature of said first substrate is higher than said second temperature of said second substrate, said p-type thermoelectric material and said n-type thermoelectric material operating to transfer thermal energy from said first substrate to said second substrate and to generate said electrical current to in a direction from said n-type thermoelectric material to said p-type thermoelectric material.

6. A thermoelectric device as in claim 1, wherein said at least one thermoelectric material comprises:

a plurality of metal atoms from at least one metal element;

a plurality of non-metal atoms from at least one non-metal element;

a crystal lattice structure, having a unit cubic cell comprised by said metal atoms and said non-metal atoms; and a plurality of filling atoms of at least one filling element disposed within said unit cubic cell, said one filling element being different from said metal element and said non-metal element, wherein said non-metal atoms, said metal atoms, and said filling atoms are selected with respect to one other to make the thermoelectric material semimetallic or semiconducting.

7. A thermoelectric device as in claim 6, wherein said unit cell includes:

eight octants disposed relative to one other to form said unit cubic cell, twenty-four of said non-metal atoms to form six quadrilaterally planar rings with each being located in six of said eight octants, eight of said metal atoms, and two of said filling atoms disposed in two of said eight octants that are not occupied by said planar rings.

8. A thermoelectric device as in claim 7, wherein a first portion of said metal atoms is from a first metal element and a second portion of said metal atoms is from a second metal element that is different from said first metal element.

9. A thermoelectric device as in claim 8, wherein said first metal element and said second metal element are in the same row of the periodic table.

10. A thermoelectric device as in claim 8, wherein said first metal element and said second metal element are in the same column of the periodic table.

11. A thermoelectric device as in claim 8, wherein said first metal element is located in a different column and a different row from said second metal element in the periodic table.

12. A thermoelectric device as in claim 8, wherein said first metal element and said second metal element are selected to make said material exhibit the n-type conductivity.

13. A thermoelectric device as in claim 8, wherein said first metal element and said second metal element are selected to make said material exhibit the p-type conductivity.

14. A thermoelectric device as in claim 7, wherein said metal element is a transition metal element selected from elements in eighth, ninth, and tenth columns of the periodic table including iron, ruthenium, osmium, cobalt, rhodium, iridium, nickel, palladium, and platinum.

15. A thermoelectric device as in claim 7, wherein a first portion of said non-metal atoms is from a first non-metal element and a second portion of said non-metal atoms is from a second non-metal element that is different from said first non-metal element.

16. A thermoelectric device as in claim 15, wherein said first non-metal element and said second non-metal element are in the same column of the periodic table.

17. A thermoelectric device as in claim 15, wherein said first non-metal element and said second non-metal element are in the same row of the periodic table.

18. A thermoelectric device as in claim 15, wherein said first non-metal element is located in a different column and a different row from said second non-metal element in the periodic table.

19. A thermoelectric device as in claim 15, wherein said first non-metal element and said second non-metal element are selected to make said material exhibit the n-type conductivity.

20. A thermoelectric device as in claim 15, wherein said first non-metal element and said second non-metal element are selected to make said material exhibit the p-type conductivity.

21. A thermoelectric device as in claim 7, wherein said non-metal element is selected from elements from the fourteenth, fifteenth, and sixteenth columns of the periodic table including pnicogen elements and chalcogen elements.

22. A thermoelectric device as in claim 7, wherein said filling element is a metallic element including a rare-earth element.

23. A thermoelectric device as in claim 22, wherein a first portion of said filling atoms is from a first metallic element and a second portion of said filling atoms is from a second metallic element that is different from said first metallic element.

24. A thermoelectric device, comprising:
a first substrate at a first temperature;
a second substrate at a second, different temperature;
at least one piece of a p-type thermoelectric material disposed between said first substrate and said second substrate, having a first end surface in thermal contact with said first substrate and a second end surface in thermal contact with said second substrate;
at least one piece of a n-type thermoelectric material disposed between said first substrate and said second substrate relative to said p-type thermoelectric material, having a first end surface in thermal contact with said first substrate and a second end surface in thermal contact with said second substrate;
an electrically conducting element, disposed to electrically connect said first surface of said p-type thermoelectric material with said first surface of said n-type thermoelectric material to provide a first electrical conduit therebetween; and
an electrical circuit, having a first terminal and a second terminal, said first terminal connecting to said second surface of said p-type thermoelectric material, said second terminal connecting to said second surface of said n-type thermoelectric material, said electrical circuit operating to provide a second electrical conduit between said p-type thermoelectric material and said n-type thermoelectric material, wherein said p-type thermoelectric material, said electrically conducting element, said n-type thermoelectric material, and said electrical circuit form an electrical loop to have an electrical current therein, wherein at least one of said p-type thermoelectric material and said n-type thermoelectric material comprises:
atoms of a first non-metal element from the fourteenth, fifteenth, and sixteenth columns of the periodic table including pnicogen elements and chalcogen elements;
atoms of a first transition metal element;
atoms of a first metallic element including a first rare-earth element;
atoms of a second non-metal element selected from the fourteenth, fifteenth, and sixteenth columns of the periodic table;
atoms of a second transition metal element; and
atoms of a second metallic element including a second rare-earth element,
wherein said atoms are disposed relative to one another to form a skutterudite structure which is semimetallic or semiconducting and has a nominal composition of:

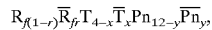

for $0 \leq f \leq 1$, $0 \leq r \leq 1$, $0 \leq x \leq 4$, and $0 \leq y \leq 12$
wherein T and $\underline{T}$ respectively represent said first and second transition metal elements, Pn and $\overline{Pn}$ respectively represent said first and second non-metal elements, R and $\underline{R}$ respectively represent said first and second metallic elements.

25. A thermoelectric device as in claim 24, wherein said first non-metal element is antimony, y and r are substantially zero, said first transition metal element is cobalt, said second transition metal element is iron, and said first metallic element is cerium, resulting in a nominal composition given by:

26. A thermoelectric device as in claim 25, wherein f is substantially 1 and x is substantially 3.5, resulting in a nominal composition given by:

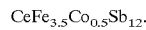

27. A thermoelectric device as in claim 25, wherein f is substantially 1 and x is substantially 2, resulting in a nominal composition with n-type conductivity given by:

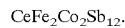

28. A thermoelectric device as in claim 24, said first non-metal element is antimony, said second non-metal element is germanium, said first transition metal is cobalt, x and r are substantially zero, and said first metallic element is cerium, resulting in a nominal composition given by:

29. A thermoelectric device as in claim 28, wherein f is substantially 1 and y is substantially 3, resulting in a nominal composition given by

30. A thermoelectric device as in claim 24, wherein said first transition metal element, second transition metal, first non-metal element, second non-metal element are cobalt, ion, antimony, and tellurium, respectively; said first metallic element is cerium and r is substantially zero, resulting in a nominal composition given by

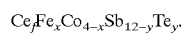

31. A thermoelectric device as in claim 24, wherein said first transition metal element, second transition metal, and first non-metal element are ion, nickel, and antimony, respectively; said first metallic element is cerium, y and r are substantially zero, resulting in a nominal composition given by $$Ce_fFe_{4-x}Ni_xSb_{12}.$$

32. A thermoelectric device as in claim 24, wherein said first transition metal element, second transition metal, and first non-metal element are ion, ruthenium, and antimony, respectively; said first metallic element is cerium, y and r are substantially zero, resulting in a nominal composition given by $$Ce_fFe_{4-x}Ru_xSb_{12}.$$

33. A thermoelectric device as in claim 24, wherein said first transition metal element T is ion, said second transition metal element $\underline{T}$ is cobalt, nickel, iridium, or ruthenium; said first non-metal element is antimony; said first metallic element R is a rare earth atom of the lanthanides series; and r and y are substantially zero, resulting in a nominal composition given by $$R_fFe_{4-x}\overline{T}_xSb_{12}.$$

34. A thermoelectric device as in claim 24, wherein said first transition metal element T is ruthenium, said second transition metal element $\underline{T}$ is cobalt, nickel, or ion; said first non-metal element is antimony, said second non-metal element is phosphorus or arsenic; said first metallic element R is a rare earth atom of the lanthanides series; and r is substantially zero, resulting in a nominal composition given by $$R_fRu_{4-x}\overline{T}_xSb_{12-y}\overline{P}n_y.$$

35. A thermoelectric device as in claim 24, wherein a unit cell in said filled skutterudite structure has a total number of valence electrons between 71 and 72.

36. A thermoelectric device as in claim 24, wherein said electrical circuit further comprises a DC power supply to drive said electrical current to flow in a direction from said n-type thermoelectric material to said p-type thermoelectric material, thus resulting a transfer of thermal energy from said first substrate to said second substrate.

37. A thermoelectric device as in claim 24, wherein said electrical circuit further comprises a DC power supply to drive said electrical current to flow in a direction from said p-type thermoelectric material to said n-type thermoelectric material, thus resulting a transfer of thermal energy from said second substrate to said first substrate.

38. A thermoelectric device as in claim 24, wherein said first temperature of said first substrate is higher than said second temperature of said second substrate, said p-type thermoelectric material and said n-type thermoelectric material operating to transfer thermal energy from said first substrate to said second substrate and to generate said electrical current to in a direction from said n-type thermoelectric material to said p-type thermoelectric material.

* * * * *